United States Patent
Matsuura et al.

(10) Patent No.: US 7,608,993 B2
(45) Date of Patent: Oct. 27, 2009

(54) BLUE ORGANIC ELECTROLUMINESCENT DEVICE COMPRISING DOPANTS HAVING ULTRAVIOLET AND VISIBLE LUMINESCENT PROPERTIES

(75) Inventors: Masahide Matsuura, Sodegaura (JP); Toshihiro Iwakuma, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 11/498,071

(22) Filed: Aug. 3, 2006

(65) Prior Publication Data
US 2007/0069638 A1    Mar. 29, 2007

(30) Foreign Application Priority Data
Sep. 5, 2005    (JP)    ............... 2005-256448

(51) Int. Cl.
*H01J 1/62*    (2006.01)
*H01J 63/04*    (2006.01)

(52) U.S. Cl. .................. 313/503; 428/917; 428/690; 313/504; 313/506; 257/40; 257/E51.044

(58) Field of Classification Search .......... 428/920, 428/917, 403–406, 69, 690; 313/498–512; 257/102, E51.043, E51.049, E51.051; 977/774, 977/815–822, 824–826, 834; 527/102, E51.043, 527/E51.049, E51.051, E51.044, 40
See application file for complete search history.

(56) References Cited

U.S. PATENT DOCUMENTS 5,602,445 A * 2/1997 Solanki et al. ............. 313/503
6,876,684 B2 * 4/2005 Kahen et al. ................. 372/39
2004/0155238 A1 * 8/2004 Thompson et al. ............ 257/40
2004/0224182 A1 * 11/2004 Lazarev ...................... 428/690
2005/0084710 A1    4/2005 Kishino et al.
2005/0196638 A1    9/2005 Son et al.
2005/0260448 A1 * 11/2005 Lin et al. .................... 428/690
2006/0024522 A1 * 2/2006 Thompson .................. 428/690
2006/0270827 A1 * 11/2006 Chen ......................... 528/394

FOREIGN PATENT DOCUMENTS

| CN | 1543275 A | 3/2004 |
|----|-----------|--------|
| CN | 1655656 A | 8/2005 |
| JP | 63-295695 | 12/1988 |
| JP | 2003-520391 | 7/2003 |
| JP | 2004-526284 | 8/2004 |

(Continued)

OTHER PUBLICATIONS

Tetsuo Tsutsui, et al., "High Quantum Efficiency in Organic Light Emitting Devices with Iridium-Complex as a Triplet Emissive Center", Jpn. J. Appl. Phys., vol. 38, No. 12B, Dec. 15, 1999, pp. L1502-L1504.

(Continued)

*Primary Examiner*—Sikha Roy
*Assistant Examiner*—Jose M Diaz
(74) *Attorney, Agent, or Firm*—Oblon, Spivak, McClelland, Maier & Neustadt, L.L.P.

(57) ABSTRACT

A blue organic electroluminescent device (1) including at least an emitting layer (40) between an anode (20) and a cathode (60), the emitting layer (40) including a host material and a plurality of dopants, at least one of the dopants having ultraviolet luminescent properties.

20 Claims, 1 Drawing Sheet

FOREIGN PATENT DOCUMENTS

| | | |
|---|---|---|
| JP | 2004-319456 | 11/2004 |
| JP | 2005-100957 | 4/2005 |
| JP | 2005-203293 | 7/2005 |
| WO | WO 02/074015 A2 | 9/2002 |

OTHER PUBLICATIONS

U.S. Appl. No. 10/588,233, filed Aug. 3, 2006, Matsuura, et al.
U.S. Appl. No. 11/480,919, filed Jul. 6, 2006, Matsuura, et al.
U.S. Appl. No. 10/588,549, filed Aug. 7, 2006, Matsuura, et al.
U.S. Appl. No. 11/512,110, filed Aug. 30, 2006, Matsuura, et al.
U.S. Appl. No. 10/588,786, filed Aug. 9, 2006, Matsuura, et al.
U.S. Appl. No. 11/480,465, filed Jul. 5, 2006, Iwakuma, et al.
U.S. Appl. No. 11/480,463, filed Jul. 5, 2006, Iwakuma, et al.
U.S. Appl. No. 10/574,179, filed Mar. 30, 2006, Iwakuma, et al.
U.S. Appl. No. 10/588,773, filed Aug. 8, 2006, Iwakuma, et al.
Hiroshi Kanno, et al., "High-efficiency top-emissive white-light-emitting organic electrophosphorescent devices", Applied Physics Letters 86, 263502, 2005, pp. 263502-1 to 263502-3.

* cited by examiner

BLUE ORGANIC ELECTROLUMINESCENT DEVICE COMPRISING DOPANTS HAVING ULTRAVIOLET AND VISIBLE LUMINESCENT PROPERTIES

TECHNICAL FIELD

The invention relates to a blue organic electroluminescent device, and particularly to a highly efficient blue organic electroluminescent device.

BACKGROUND ART

An organic electroluminescent device (hereinafter abbreviated as "organic EL device") using an organic substance is a promising solid-state emitting type inexpensive and large full-color display device. Accordingly, the organic EL device has been extensively developed. In-general, an organic EL device includes an emitting layer and a pair of opposing electrodes holding the emitting layer therebetween.

When an electric field is applied between the electrodes, electrons are injected from the cathode and holes are injected from the anode. The electrons recombine with the holes in the emitting layer to produce an excited state, and energy is emitted as light when the excited state returns to the ground state.

Various organic EL devices have been known. For example, patent document 1 discloses an organic EL device having a device configuration of indium tin oxide (ITO)/hole transporting layer/emitting layer/cathode, in which an aromatic tertiary amine is used as the material for the hole transporting layer. This device configuration achieves a high luminance of several hundred cd/m$^2$ at an applied voltage of 20 V or less. It has been reported that a luminous efficiency of about 40 lm/W or more is achieved at a luminance equal to or less than several thousand cd/m$^2$ by using an iridium complex (phosphorescent dopant) for the emitting layer (non-patent document 1).

Patent document 2 discloses a highly efficient organic EL device utilizing the migration of plural visible luminescent dopants. Patent documents 3 and 4 disclose red fluorescent EL devices using Irppy as an auxiliary dopant.

Non-patent document 2 discloses an organic EL device having a host:dopant complex two-layer configuration using two host materials and two dopant complexes (e.g. trisphenylpyrazolediridium (Irsppzd$_3$)). In the non-patent document 2, the dopant complexes have a luminous peak of 450 nm or more.

Patent document 5 discloses an organic EL device using two types of dopants in the emitting layer. In the patent document 5, the dopants are each phosphorescent metal complexes of which the ligand is an organic compound. One of the two types of dopants with a longer maximum emission wavelength has a substituent in the ligand structure, and is contained in the emitting layer at a concentration lower than that of the other dopant.

Patent document 6 discloses technology which limits the highest occupied molecular orbital (HOMO) and the lowest unoccupied molecular orbital (LUMO) of a host and a phosphorescent dopant contained in the emitting layer. The patent document 6 discloses an example in which a dopant is a complex which emits light in the visible region, and one dopant is contained in the emitting layer.

[Patent document 1] JP-A-63-295695
[Patent document 2] JP-A-2004-319456
[Patent document 3] JP-T-2003-520391
[Patent document 4] JP-T-2004-526284
[Patent document 5] JP-A-2005-100957
[Patent document 6] JP-A-2005-203293
[Non-patent document 1] T. Tsutsui et. al., Jpn. J. Appl. Phys. Vol. 38 (1999), pp. L1502 to L1504
[Non-patent document 2] Appl. Phys. Lett. 86, 263502 (2005)

Since most of these phosphorescent organic EL devices emit green or red light, an increase in the number of colors and particularly an increase in blue luminous efficiency have been demanded. In particular, a blue device configuration with a luminous quantum efficiency of 5% or more is rare.

When applying an organic EL device to a flat panel display or the like, the organic EL device is required to exhibit an improved luminous efficiency and reduced power consumption. However, the above device configuration has a disadvantage in that the luminous efficiency significantly decreases accompanying an increase in the luminance. Therefore, it is difficult to reduce the power consumption of the flat panel display.

An object of the invention is to develop a blue organic EL device exhibiting a high current efficiency or a high luminous efficiency.

DISCLOSURE OF THE INVENTION

According to the invention, the following blue organic EL device is provided.

1. A blue organic electroluminescent device comprising at least an emitting layer between an anode and a cathode, the emitting layer including a host material and a plurality of dopants, at least one of the dopants having ultraviolet luminescent properties.
2. The blue organic electroluminescent device according to 1, wherein the dopant having ultraviolet luminescent properties has a peak of 450 nm or less in the ultraviolet luminescence region.
3. The blue organic electroluminescent device according to 1 or 2, wherein the dopant having ultraviolet luminescent properties has a triplet energy gap greater than the triplet energy gap of another dopant.
4. The blue organic electroluminescent device according to any one of 1 to 3, wherein at least one of the dopants has an ionization potential lower than that of the host material.
5. The blue organic electroluminescent device according to any one of 1 to 4, wherein at least one of the dopants has an electron affinity lower than that of the host material.
6. The blue organic electroluminescent device according to any one of 1 to 5, wherein at least one of the dopants is a heavy metal complex.
7. The blue organic electroluminescent device according to any one of 1 to 6, wherein all of the dopants are heavy metal complexes.
8. The blue organic electroluminescent device according to 6 or 7, wherein at least one of the heavy metal complexes is a carbene complex or a pyrazole complex.
9. The blue organic electroluminescent device according to any one of 6 to 8, wherein at least one of the dopants has an ionization potential lower than that of the host material and a luminous intensity one tenth or less that of the luminous (EL) peak wavelength from the device.
10. The blue organic electroluminescent device according to any one of 6 to 9, comprising a hole transporting layer and/or an electron transporting layer between the emitting layer and the anode and/or the cathode, wherein at least one of the heavy metal complexes has a triplet energy gap smaller than the triplet energy gap of a compound(s) forming the hole transporting layer and/or the electron transporting layer.

11. The blue organic electroluminescent device according to 10, wherein at least one of the heavy metal complexes has a triplet energy gap smaller than the triplet energy gap of the compound(s) forming the hole transporting layer and/or the electron transporting layer in an amount of 0.2 eV or more.

According to the invention, a blue organic EL device exhibiting a high current efficiency or a high luminous efficiency can be provided.

BEST MODE FOR CARRYING OUT THE INVENTION

Figure 1:
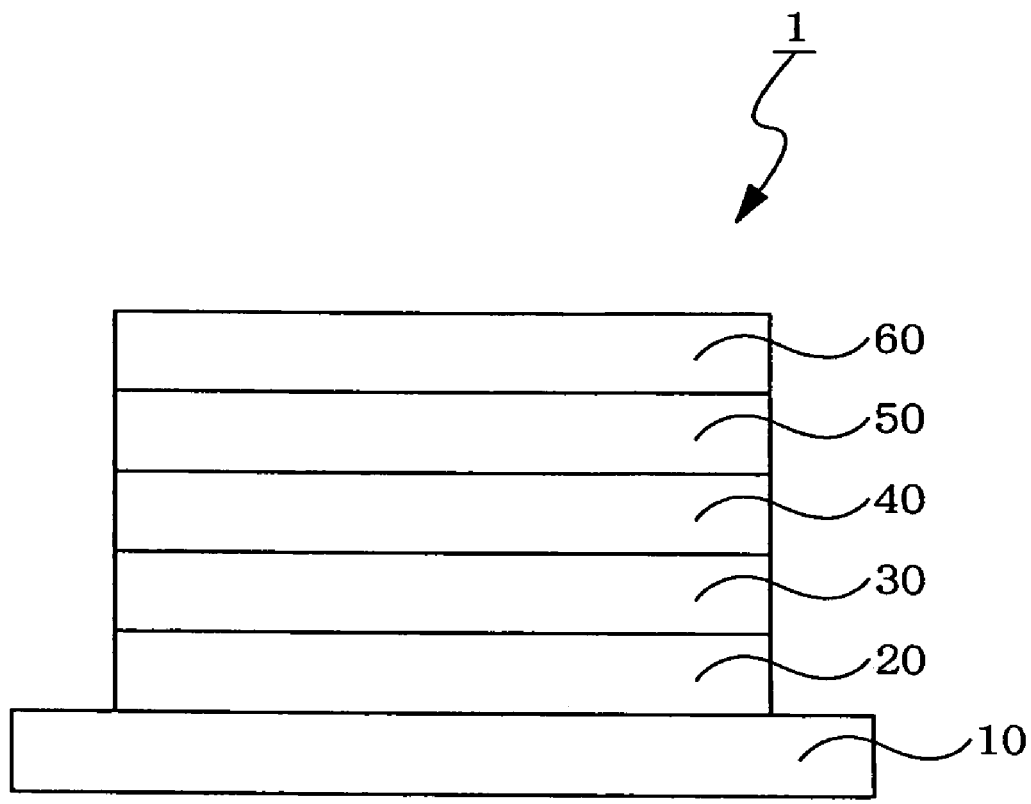
FIG. 1 is a view showing one embodiment of a blue organic EL device according to the invention.

A blue organic EL device according to the invention has a configuration in which at least an emitting layer is provided between an anode and a cathode.

The emitting layer includes a host material and a plurality of dopants. At least one of the dopants is a dopant which emits light in the ultraviolet region (ultraviolet luminescent properties). This dopant is preferably a heavy metal complex. It is preferable that at least one of the dopants have an ionization potential lower than that of the host material.

In the device according to the invention, the carrier balance in the emitting layer is maintained to increase the recombination probability of holes and electrons in the emitting layer, whereby a high current efficiency can be achieved.

A visible luminescent dopant and an ultraviolet luminescent dopant may be included in one emitting layer, or a visible luminescent dopant and an ultraviolet luminescent dopant may be respectively included in different emitting layers.

The ultraviolet luminescent dopant preferably has a peak at a wavelength of 450 nm or less in the ultraviolet luminescence region. The dopant more preferably has a peak at a wavelength of 350 to 420 nm.

The ultraviolet luminescent dopant preferably has a triplet energy gap greater than that of the other dopant.

If the ultraviolet luminescent dopant has a peak in the ultraviolet luminescence region of 450 nm or less and a triplet energy gap greater than that of the other dopant, the excitation energy can be transferred from the ultraviolet luminescent dopant to the visible luminescent dopant. This achieves a high efficiency.

It is preferable that at least one of the dopants (more preferably the ultraviolet luminescent dopant) have an ionization potential lower than that of the host material.

If the ultraviolet luminescent dopant has an ionization potential lower than that of the host material, the ultraviolet luminescent dopant functions as a carrier-retaining dopant which can retain holes in the emitting layer. This increases the recombination probability, whereby the luminous current efficiency of the device is improved.

It is preferable that at least one of the dopants (more preferably the ultraviolet luminescent dopant) have an electron affinity lower than that of the host material.

Since the ultraviolet luminescent dopant need not directly contribute to luminescence, it is preferable that the ultraviolet luminescent dopant have an electron affinity lower than that of the host material.

It is preferable that at least one of the dopants be a blue visible luminescent dopant.

The blue visible luminescent dopant preferably has a peak at a wavelength of 380 nm to 495 nm in the visible luminescence region. The dopant more preferably has a peak at a wavelength of 400 to 480 nm.

It is preferable that the blue visible luminescent dopant be a heavy metal complex. The color of light emitted from the device is generally determined by the blue visible luminescent dopant. The current efficiency can be increased in comparison with a fluorescent organic EL device by using such a complex. The dopant (ortho metal complex) is not particularly limited insofar as the dopant emits phosphorescence in the temperature range in which the device operates. It is preferable that the dopant be a metal complex of Ir, Pt, Os, Pd, Au, or the like. In particular, an Ir or Pt complex is preferable.

In the "blue phosphorescence" region, since the difference in the energy level between the host material and the visible phosphorescent heavy metal dopant is reduced, it becomes difficult to accumulate carriers in the emitting layer, whereby efficiency is decreased. Light from the blue green region to the blue region can be emitted with high efficiency by providing the ultraviolet luminescent dopant in the emitting layer together with the visible luminescent dopant.

It is preferable that all of the dopants be heavy metal complexes. It is more preferable that at least one of the heavy metal complexes be a carbene complex or a pyrazole complex.

It is preferable that at least one of the dopants have an ionization potential lower than that of the host material and a luminous intensity one tenth or less that of the luminous (EL) peak wavelength from the device.

The blue organic EL device according to the invention may include a hole transporting layer and/or an electron transporting layer between the emitting layer and the anode and/or the cathode.

FIG. 1 is a cross-sectional view showing an example of such a blue organic EL device.

An organic EL device 1 has a configuration in which a substrate 10, an anode 20, a hole transporting layer 30, an emitting layer 40, an electron transporting layer 50, and a cathode 60 are stacked in that order.

The emitting layer 40 includes a plurality of dopants, which may be heavy metal complexes. It is preferable that at least one of the heavy metal complexes have a triplet energy gap lower than that of at least one of compounds forming the hole transporting layer and/or the electron transporting layer. This achieves a higher efficiency.

It is preferable that at least one of the heavy metal complexes have a triplet energy gap smaller than that of at least one of compounds forming the hole transporting layer and/or the electron transporting layer in an amount of 0.2 eV or more.

In this example, the anode 20 and the hole transporting layer 30, the hole transporting layer 30 and the emitting layer 40, the emitting layer 40 and the electron transporting layer 50, and the electron transporting layer 50 and the cathode 60 are respectively in contact. Note that another layer may be provided between these layers.

Each member of the blue organic EL device according to the invention is described below.

The material for the ultraviolet luminescent dopant included in the emitting layer is not particularly limited insofar as the dopant emits light in the ultraviolet luminescence region. The peak in the ultraviolet luminescence region is preferably measured at room temperature. In the case of a dopant of which luminescence cannot be observed at room temperature, the peak in the ultraviolet luminescence region may be measured at a temperature of 77 K.

It is preferable that the visible luminescent dopant and/or the ultraviolet luminescent dopant be a carbene complex and a heavy metal complex having a pyrazole derivative as the ligand disclosed in Japanese Patent Application No. 2005-103004.

It is more preferable that the ultraviolet luminescent dopant be a compound having a peak at a wavelength of 450 nm or less in the ultraviolet luminescence region. A carbene complex disclosed in WO2005/019373 may also be used. As the ultraviolet luminescent dopant, it is preferable to use compounds having an emission wavelength of 450 nm or less among these compounds.

Organic compounds disclosed in WO2004/045001 and US2004091738, borate complexes disclosed in WO2002/015645, JP-T-2004-506305, and WO2004/017043, and skeleton complexes with a shortened conjugated system of a phenylpyridine ligand disclosed in EP1211257A2 and JP-A-2003-081989 may also be used. As the ultraviolet luminescent dopant, it is preferable to use compounds having an emission peak wavelength of 450 nm or less among these compounds.

The blue visible luminescent dopant included in the emitting layer is not particularly limited insofar as the dopant emits phosphorescence in the temperature range in which the device operates. A metal complex of Ir, Pt, Os, Pd, Au, or the like is preferable. In particular, an Ir or Pt complex is preferable. Specific examples of such metal complexes are given below.

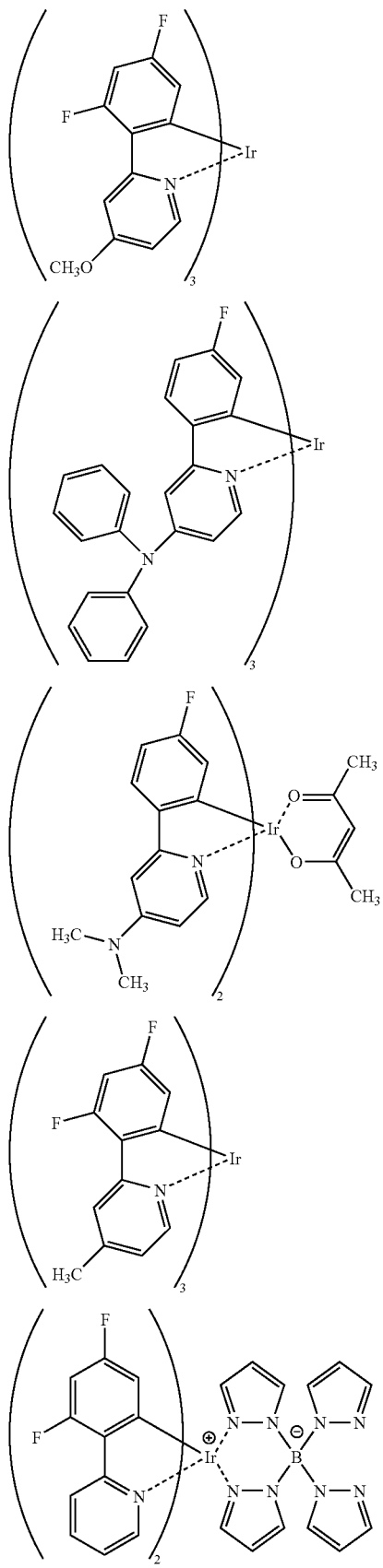

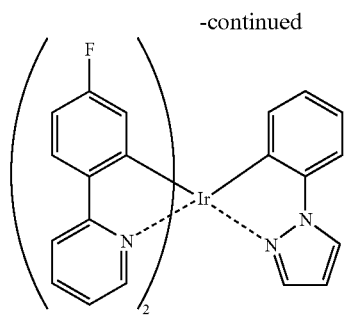
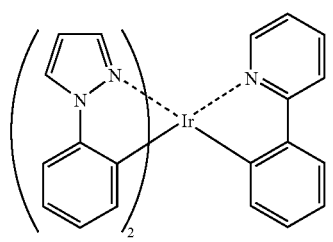
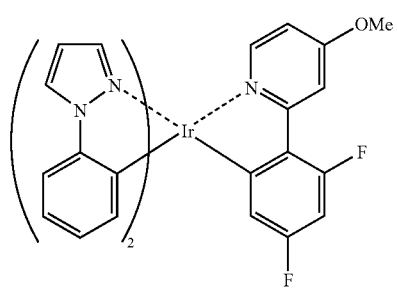
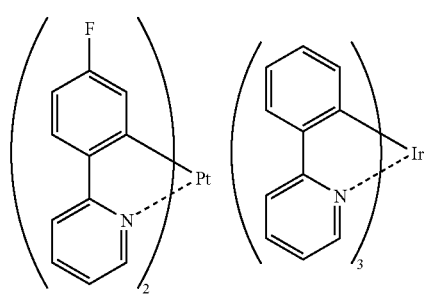
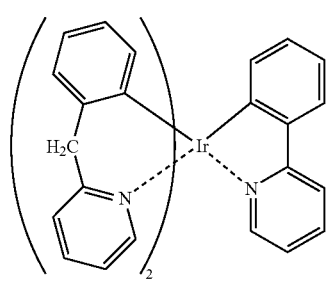
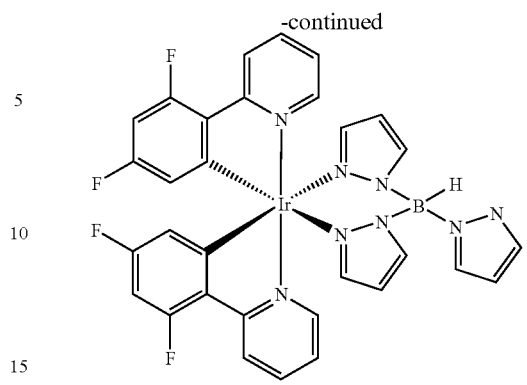
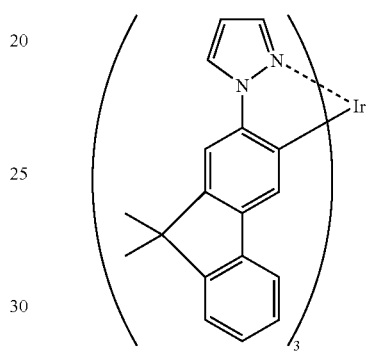
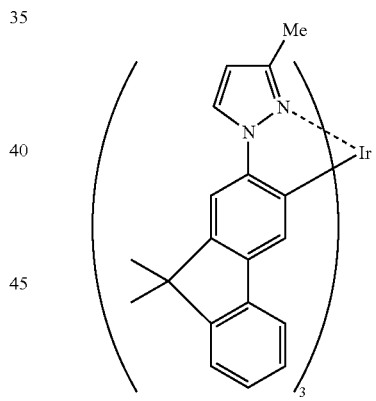
wherein Me indicates a methyl group.
The following heavy metal complexes may be used as the ultraviolet luminescent dopant.
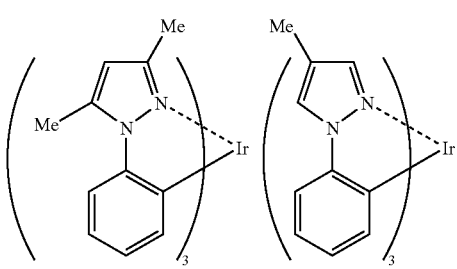

-continued

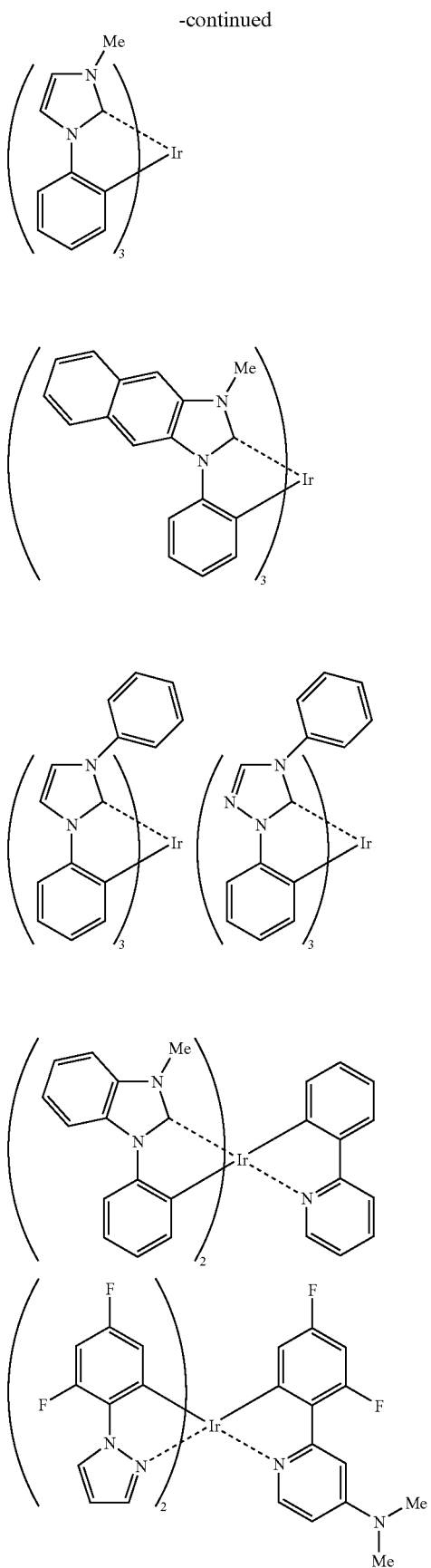

-continued

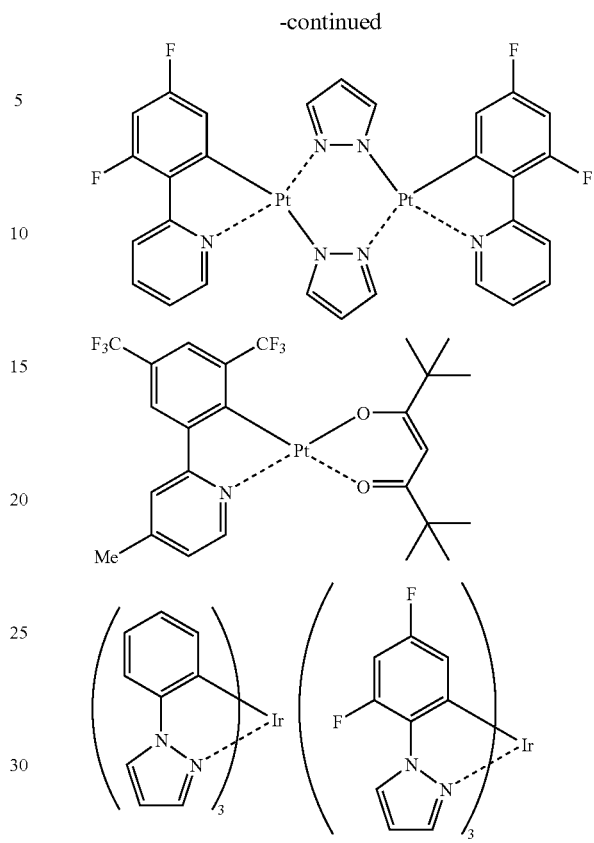

The host material included in the emitting layer is not particularly limited. A material widely used for organic EL may be used. It is preferable to use a material having a triplet energy gap greater than that of the visible luminescent dopant. As the host material, amine derivatives, carbazole derivatives, oxadiazole derivatives, triazole derivatives, benzoxazole type, benzothiazole type, and benzimidazole type fluorescent whitening agents, metal chelate oxanoid compounds, styryl compounds, and the like may be used. A compound exhibiting excellent thin film formability is preferable.

It is preferable that the host material be an organic compound having at least one carbazolyl group. Specific examples of such an organic compound are given below.

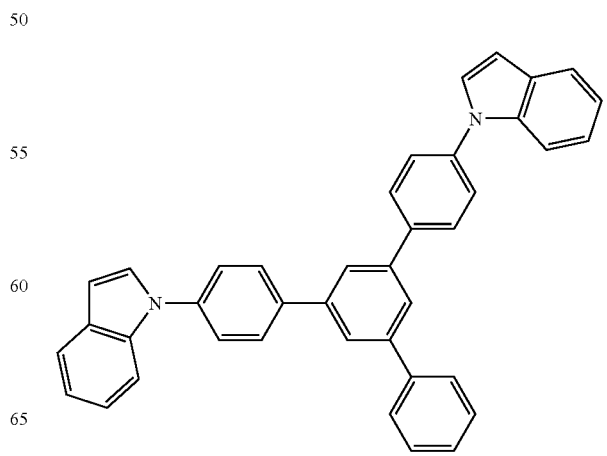

-continued
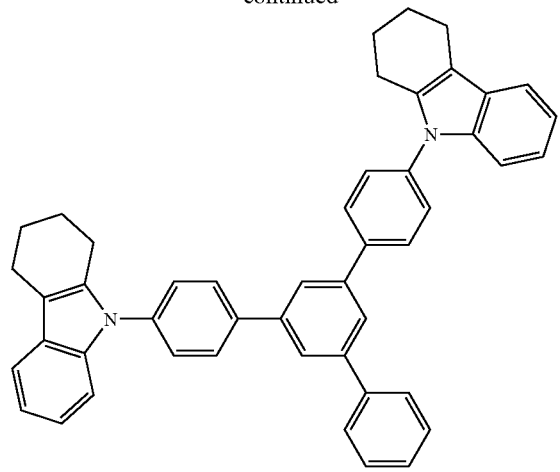
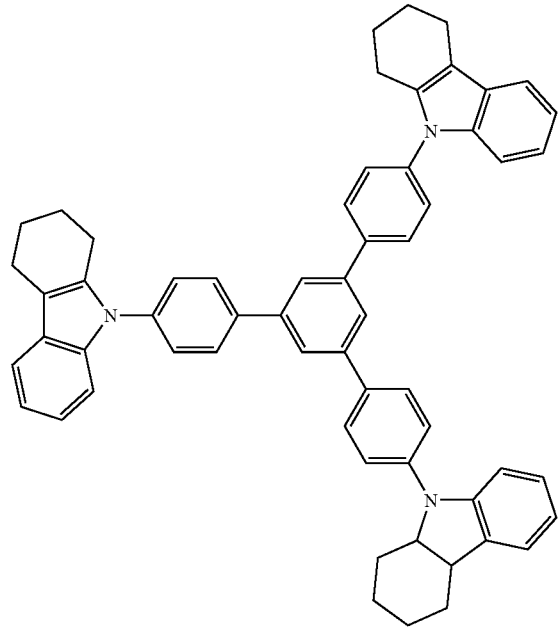
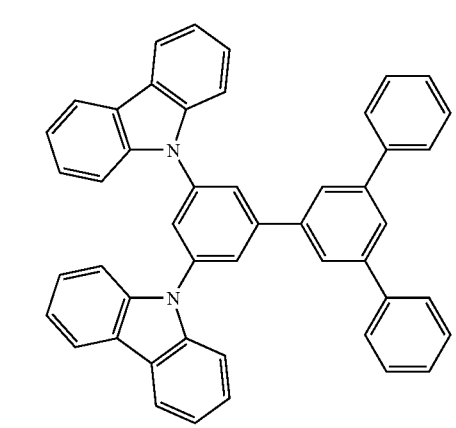
-continued
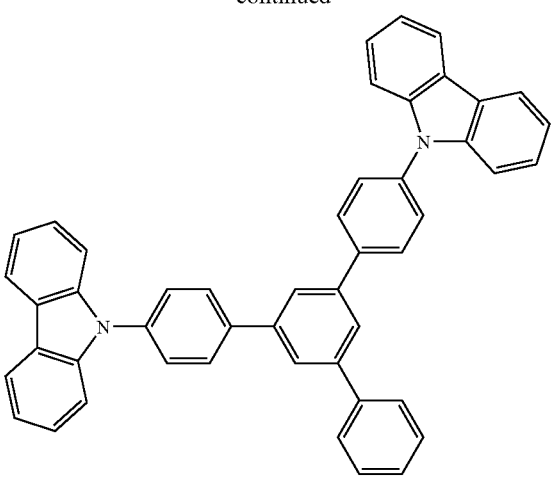
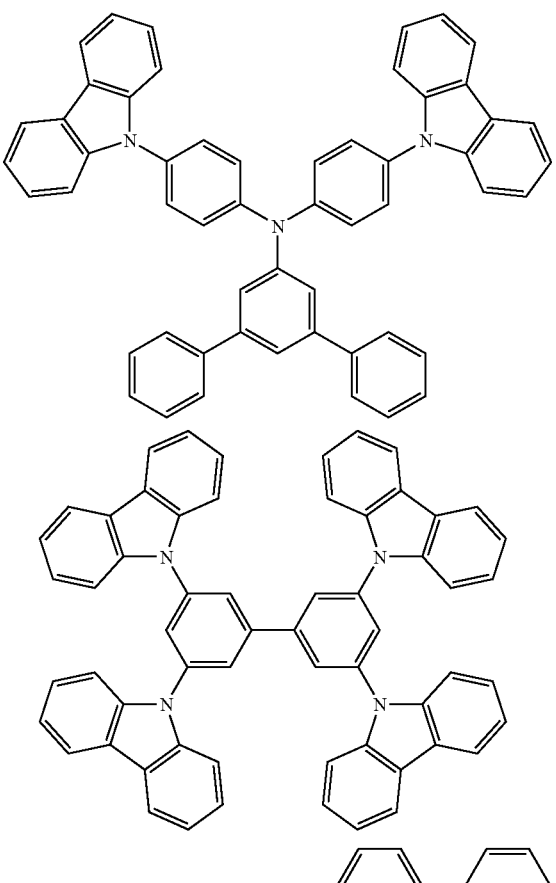
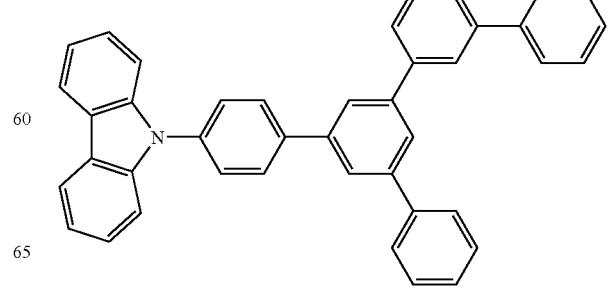

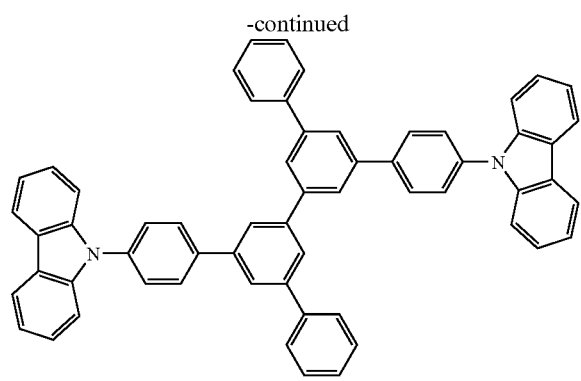
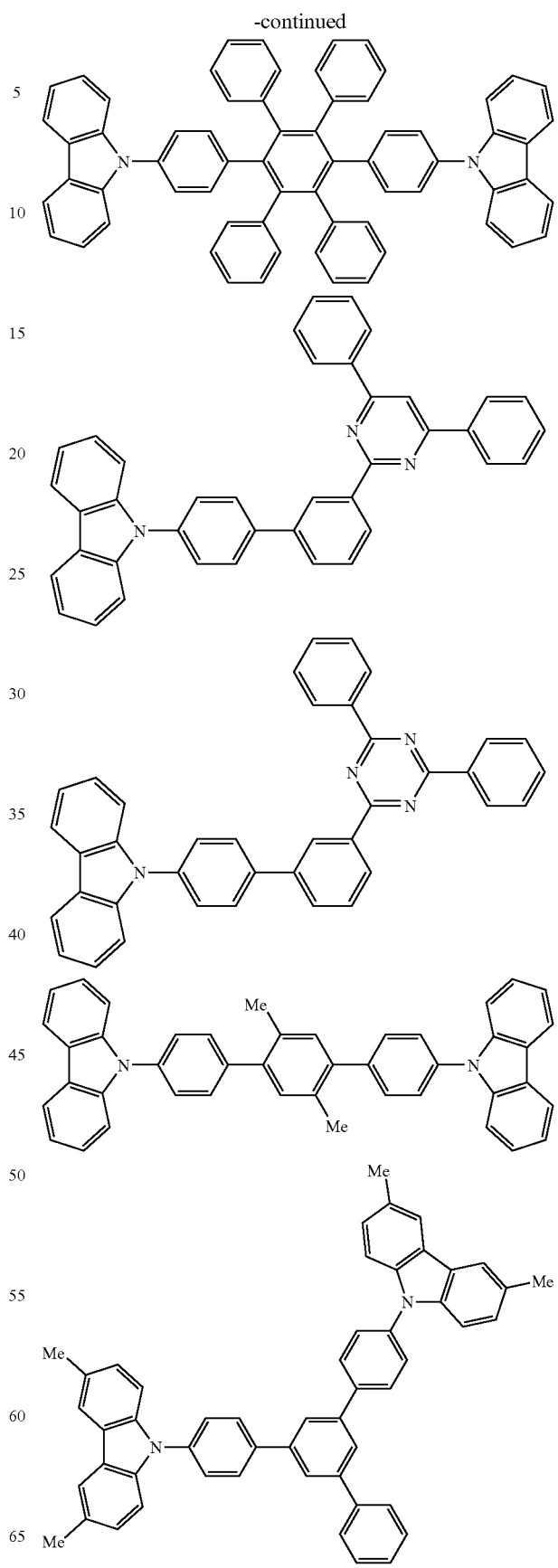

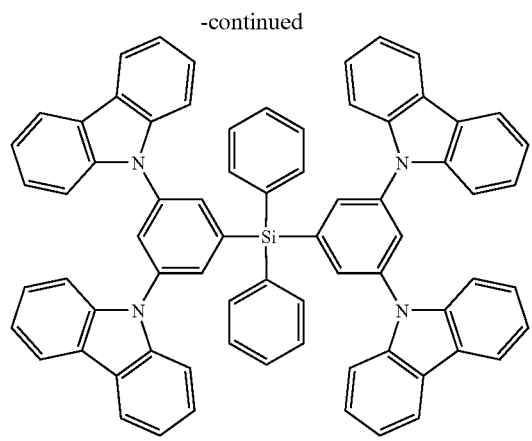

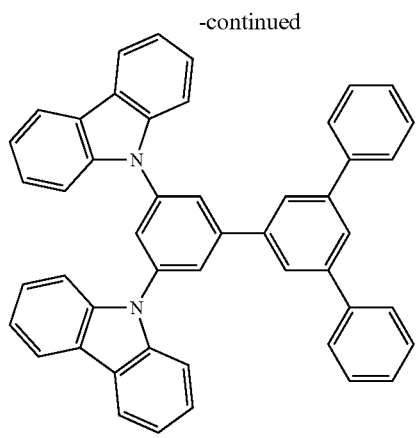

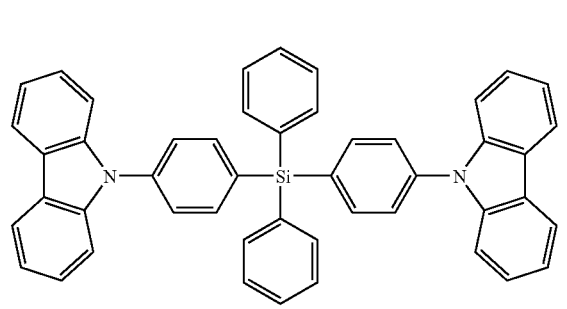

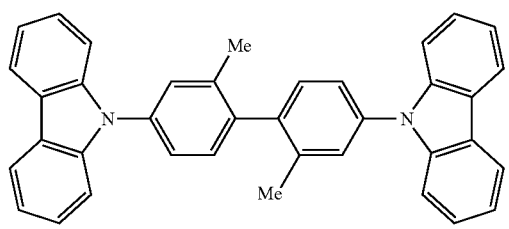

It is preferable that the triplet energy level ($Eg^T$(HOST)) of the host material included in the emitting layer be greater than the triplet energy level ($Eg^T$(Dopant)) of the visible luminescent dopant included in the emitting layer. This relationship allows the excitation energy to be efficiently transferred from the host material to the dopant, whereby luminous efficiency is further improved.

It is more preferable to use a host material and a dopant satisfying the following condition.

$Eg^T$(Dopant)+0.2≦$Eg^T$(HOST)(eV)

The following organic compounds can be given as specific examples.

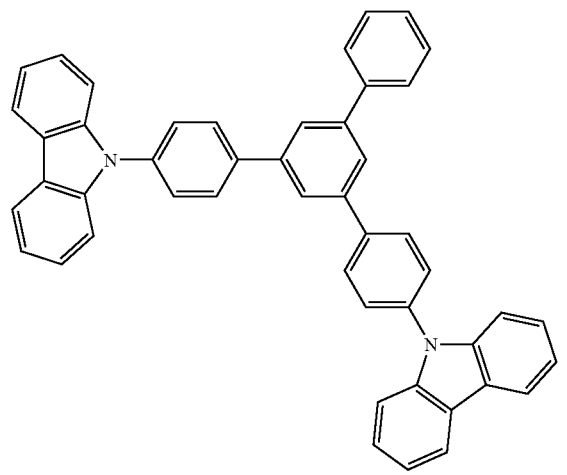

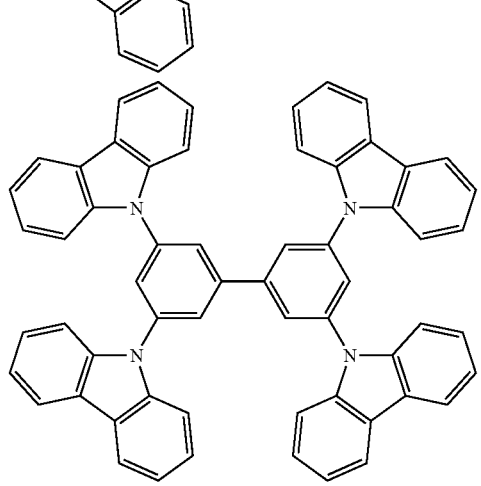

The host material may also be an Si-containing organic compound of the following formula.

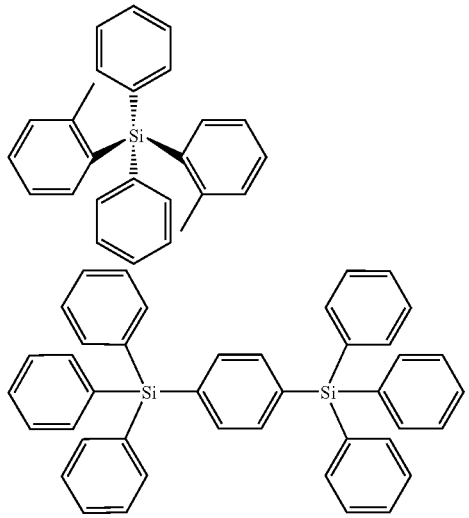

The organic EL device according to the invention is preferably supported on a substrate. The material for the substrate is not particularly limited. A known material used for an organic EL device such as glass, transparent plastic, or quartz may be used.

As the material for the anode, a metal, an alloy, or an electric conductive compound having a work function of 4 eV or more, or a mixture of these materials is preferably used. As specific examples thereof, metals such as Au and dielectric transparent materials such as CuI, ITO (indium tin oxide), $SnO_2$, and ZnO can be given. The anode may be formed by forming a thin film of the above material by deposition, sputtering, or the like. When outcoupling light from the emitting layer through the anode, it is preferable that the anode have a transmittance of more than 10%. The sheet resistance of the anode is preferably several hundred ohm/square or less. The thickness of the anode is usually 10 nm to 1 μm, and preferably 10 to 200 nm, although the thickness varies depending on the material.

As the material for the cathode, a metal, an alloy, or an electric conductive compound having a work function of 4 eV or less, or a mixture of these materials is preferably used. As specific examples of such a material, sodium, lithium, aluminum, a magnesium/silver mixture, a magnesium/copper mixture, $Al/Al_2O_3$, indium, and the like can be given. The cathode may be formed by forming a thin film of the above material by deposition, sputtering, or the like. When outcoupling light from the emitting layer through the cathode, it is preferable that the cathode have a transmittance of more than 10%. The sheet resistance of the cathode is preferably several hundred ohm/square or less. The thickness of the cathode is usually 10 nm to 1 μm, and preferably 50 to 200 nm, although the thickness varies depending on the material.

In the organic EL device according to the invention, a hole transporting layer and/or an electron transporting layer may be provided, as required, in order to increase efficiency.

The hole transporting layer (including hole injecting layer) is not limited insofar as the layer has a function of injecting holes from the anode, a function of transporting holes, or a function of blocking electrons injected from the cathode.

As specific examples of the compound forming the hole transporting layer, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, poly(N-vinylcarbazole) derivatives, aniline copolymers, conductive high-molecular-weight oligomers such as thiophene oligomers and polythiophene, organosilane derivatives, and the like can be given. The hole transporting layer may have a single-layer structure formed of one, or two or more of the compounds forming the layer, or may have a multilayer structure formed of a plurality of layers of the same composition or different compositions.

The compound forming the hole transporting layer is preferably a compound having a carbazolyl group or bonding at the m-positions. This increases the singlet energy level and the triplet energy level of the compound, whereby efficiency is increased. In more detail, it is preferable to use a compound disclosed in JP-A-2002-203683 as the compound forming the hole transporting layer contacting the anode.

The electron transporting layer (including electron injecting layer) may be a layer having a function of injecting electrons from the cathode, a function of transporting electrons, or a function of blocking holes injected from the anode.

As examples of the compound forming the electron transporting layer, triazole derivatives, oxazole derivatives, oxadiazole derivatives, imidazole derivatives, carbazole derivatives, fluorenone derivatives, anthraquinodimethane derivatives, anthrone derivatives, diphenylquinone derivatives, thiopyran dioxide derivatives, carbodiimide derivatives, fluorenylidenemethane derivatives, distyrylpyrazine derivatives, aromatic tetracarboxylic anhydrides such as naphthalene and perylene, various metal complexes represented by metal complexes of a phthalocyanine derivative and 8-quinolinol derivative and metal complexes having metal phthalocyanine, benzoxazole, or benzothiazole as the ligand, organosilane derivatives, and the like can be given. The electron transporting layer may have a single-layer structure formed of one, or two or more of the compounds forming the layer, or may have a multilayer structure formed of a plurality of layers of the same composition or different compositions.

In the organic EL device according to the invention, it is preferable that the electron transporting layer be made of a compound having a Π-electron-deficient nitrogen-containing hetero ring in the molecular skeleton.

As preferred examples of the Π-electron-deficient nitrogen-containing hetero ring derivative, a derivative of a nitrogen-containing five-membered ring selected from a benzimidazole ring, a benzotriazole ring, a pyridinoimidazole ring, a pyrimidinoimidazole ring, and a pyridazinoimidazole ring, and a nitrogen-containing six-membered ring derivative containing a pyridine ring, a pyrimidine ring, a pyrazine ring, or a triazine ring can be given.

Specific examples of such derivatives are given below.
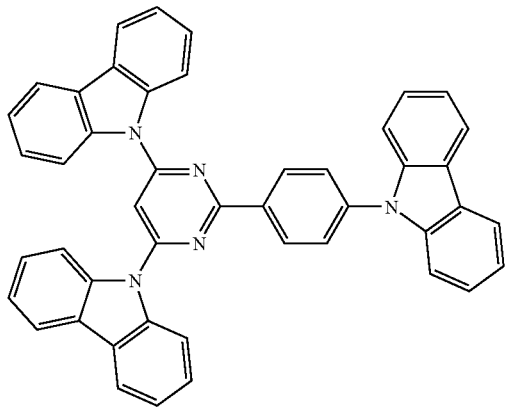
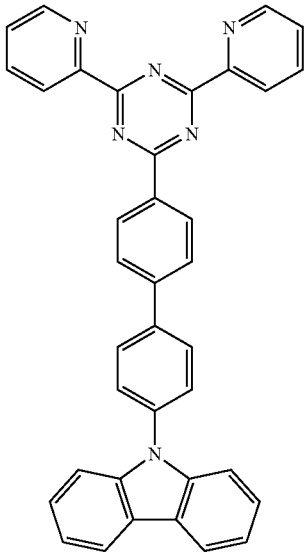
-continued
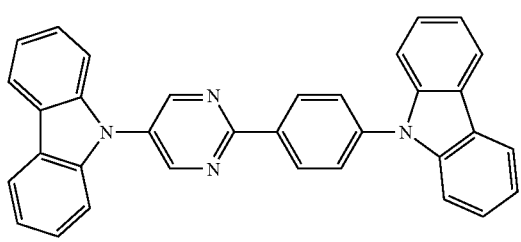

-continued
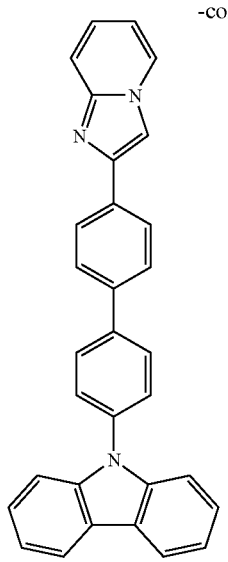
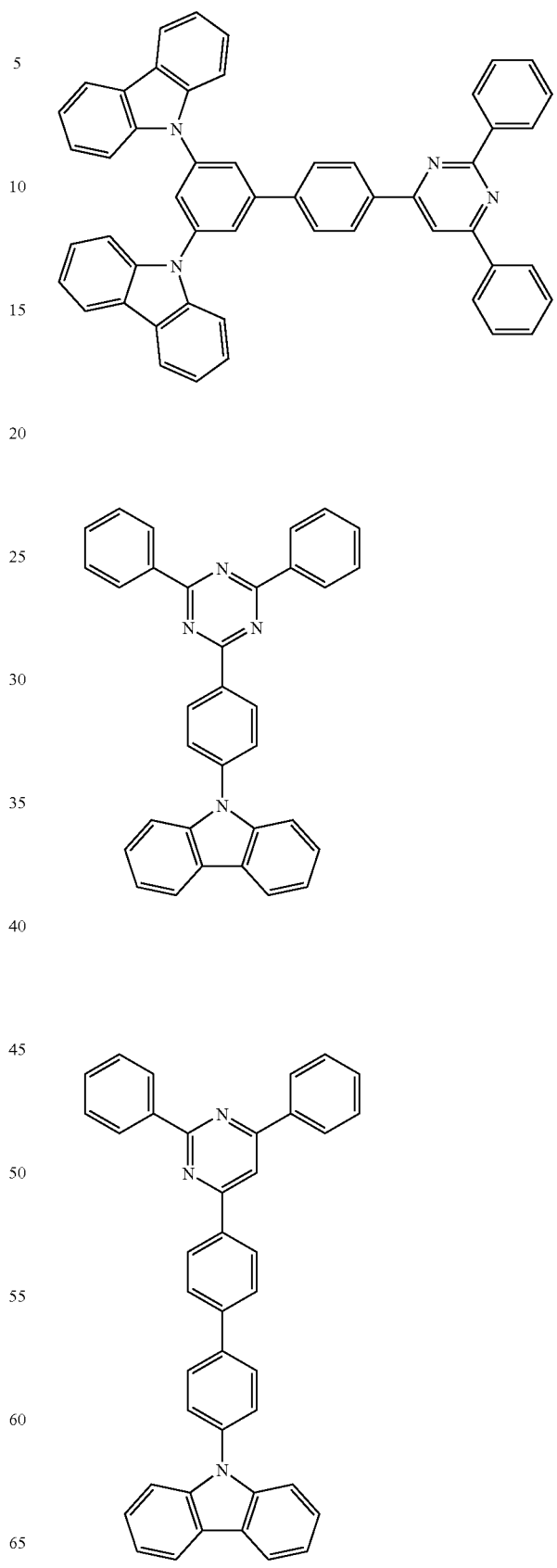

-continued

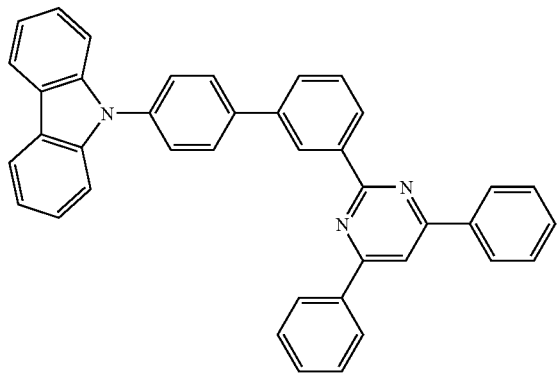

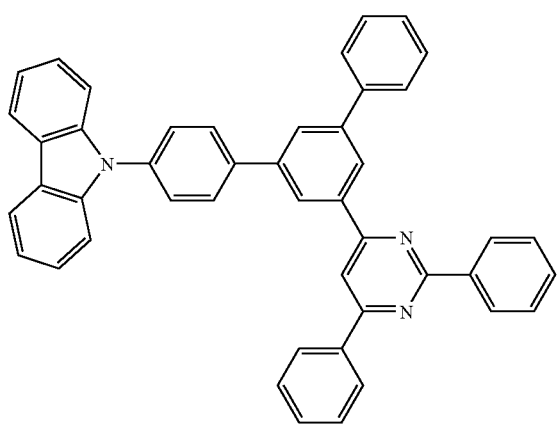

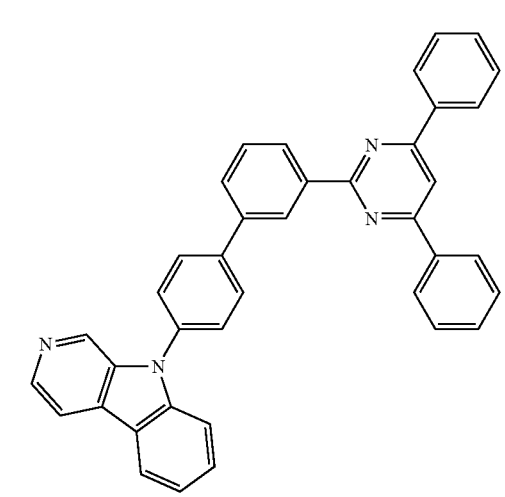

-continued

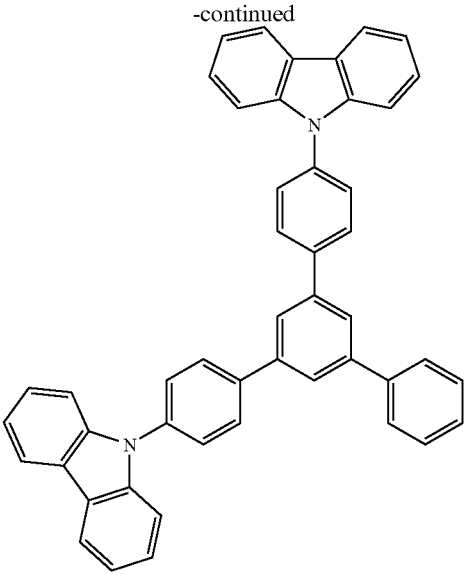

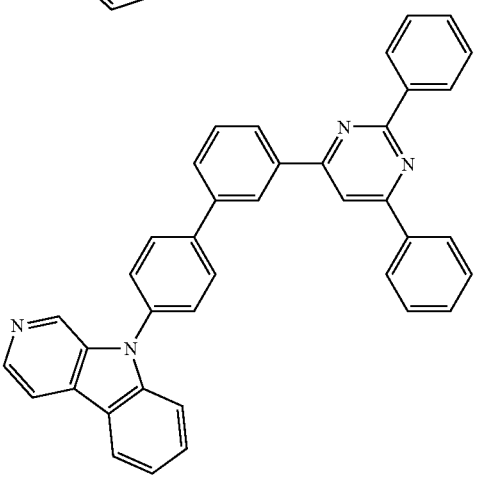

The nitrogen-containing five-membered ring derivative is preferably selected from a benzimidazole ring, a benzotriazole ring, a pyridinoimidazole ring, a pyrimidinoimidazole ring, and a pyridazinoinidazole ring. The nitrogen-containing five-membered ring derivative is preferably a compound of the following formula (I).

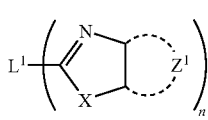

(I)

wherein $L^1$ represents a linking group with a valence of n, X represents —O—, —S—, or =N—$R^1$ ($R^1$ represents a hydrogen atom, an aliphatic hydrocarbon group, an aromatic hydrocarbon group, or a heterocyclic group), $Z^1$ represents a group forming an aromatic ring, and n represents an integer from 2 to 6.

In the formula (I), $L^1$ represents a linking group with a valence of n, preferably a linking group formed of carbon, silicon, nitrogen, boron, oxygen, sulfur, a metal, a metal ion, and the like, more preferably a carbon atom, a nitrogen atom, a silicon atom, a boron atom, an oxygen atom, a sulfur atom, an aromatic hydrocarbon ring, or an aromatic hetero ring, and still more preferably a carbon atom, a silicon atom, an aromatic hydrocarbon ring, or an aromatic hetero ring. Specific examples of the linking group represented by $L^1$ are given below.

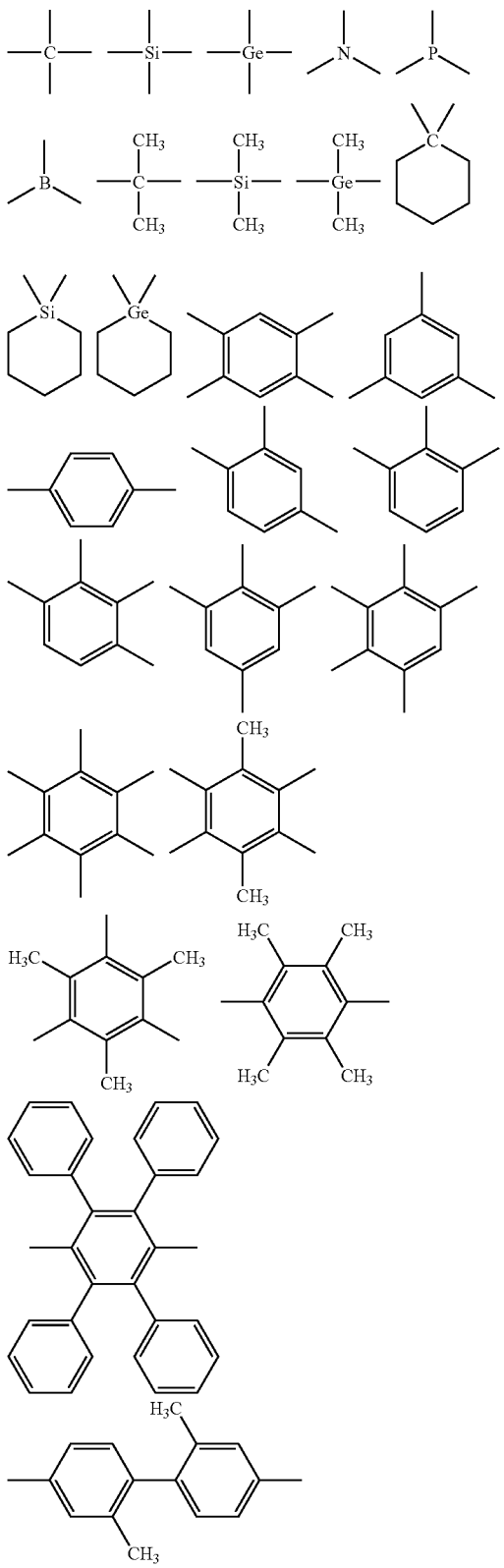

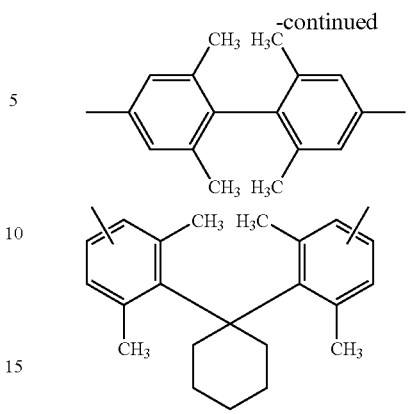

In the formula (I), X represents —O—, —S—, or =N—$R^1$. $R^1$ represents a hydrogen atom, an aliphatic hydrocarbon group, an aromatic hydrocarbon group, or a heterocyclic group.

The aliphatic hydrocarbon group represented by $R^1$ is a linear, branched, or cyclic alkyl group (alkyl group having preferably 1 to 20 carbon atoms, more preferably 1 to 12 carbon atoms, and particularly preferably 1 to 8 carbon atoms, such as methyl, ethyl, iso-propyl, tert-butyl, n-octyl, n-decyl, n-hexadecyl, cyclopropyl, cyclopentyl, or cyclohexyl), an alkenyl group (alkenyl group having preferably 2 to 20 carbon atoms, more preferably 2 to 12 carbon atoms, and particularly preferably 2 to 8 carbon atoms, such as vinyl, allyl, 2-butenyl, or 3-pentenyl), or an alkynyl group (alkynyl group having preferably 2 to 20 carbon atoms, more preferably 2 to 12 carbon atoms, and particularly preferably 2 to 8 carbon atoms, such as propynyl or 3-pentynyl), and preferably an alkyl group.

An aryl group represented by $R^1$ is a monocyclic or condensed ring aryl group having preferably 6 to 30 carbon atoms, more preferably 6 to 20 carbon atoms, and still more preferably 6 to 12 carbon atoms. The aryl group may be replaced. As examples of the aryl group, phenyl, 2-methylphenyl, 3-methylphenyl, 4-methylphenyl, 2-methoxyphenyl, 3-trifluoromethylphenyl, pentafluorophenyl, 1-naphthyl, 2-naphthyl, and the like can be given.

The heterocyclic group represented by $R^1$ is a monocyclic or condensed ring heterocyclic group (heterocyclic group having preferably 1 to 20 carbon atoms, more preferably 1 to 12 carbon atoms, and still more preferably 2 to 10 carbon atoms), and preferably an aromatic heterocyclic group containing at least one of a nitrogen atom, an oxygen atom, a sulfur atom, and a selenium atom.

As specific examples of the heterocyclic group represented by $R^1$, pyrrolidine, piperidine, piperazine, morpholine, thiophene, selenophene, furan, pyrrole, imidazole, pyrazole, pyridine, pyrazine, pyridazine, pyrimidine, triazole, triazine, indole, indazole, purine, thiazoline, thiazole, thiadiazole, oxazoline, oxazole, oxadizole, quinoline, isoquinoline, phthalazine, naphthyridine, quinoxaline, quinazoline, cinnoline, pteridine, acridine, phenanthroline, phenazine, tetrazole, benzimidazole, benzoxazole, benzothiazole, benzotriazole, tetrazaindene, carbazole, azepine, and the like can be given. Of these, furan, thiophene, pyridine, pyrazine, pyrimidine, pyridazine, triazine, quinoline, phthalazine, naphthyridine, quinoxaline, and quinazoline are preferable, with furan, thiophene, pyridine, and quinoline being more preferable, and quinoline being still more preferable.

The aliphatic hydrocarbon group, the aryl group, and the heterocyclic group represented by $R^1$ may have a substituent. The substituent is preferably an alkyl group, an alkenyl group, an alkynyl group, an aryl group, an amino group, an alkoxy group, an aryloxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a sulfonyl group, a halogen atom, a cyano group, or a heterocyclic group, more preferably an alkyl group, an aryl group, an alkoxy group, an aryloxy group, a halogen atom, a cyano group, or a heterocyclic group, still more preferably an alkyl group, an aryl group, an alkoxy group, an aryloxy group, or an aromatic heterocyclic group, and particularly preferably an alkyl group, an aryl group, an alkoxy group, or an aromatic heterocyclic group.

$R^1$ preferably represents an alkyl group, an aryl group, or an aromatic heterocyclic group, more preferably an aryl group or an aromatic heterocyclic group, and still more preferably an aryl group. X preferably represents —O— or =N—$R^1$, more preferably =N—$R^1$, and particularly preferably =N—$Ar^1$ ($Ar^1$ represents an aryl group (aryl group having preferably 6 to 30 carbon atoms, more preferably 6 to 20 carbon atoms, and still more preferably 6 to 12 carbon atoms) or an aromatic heterocyclic group (heterocyclic group having preferably 1 to 20 carbon atoms, more preferably 1 to 12 carbon atoms, and still more preferably 2 to 10 carbon atoms), and preferably an aryl group).

$Z^1$ represents an atomic group necessary for forming an aromatic ring. The aromatic ring formed by $Z^1$ may be an aromatic hydrocarbon ring or an aromatic hetero ring. As specific examples of the aromatic ring formed by $Z^1$, a benzene ring, a pyridine ring, a pyrazine ring, a pyrimidine ring, a pyridazine ring, a triazine ring, a pyrrole ring, a furan ring, a thiophene ring, a selenophene ring, a tellurophene ring, an imidazole ring, a thiazole ring, a selenazole ring, a tellurazole ring, a thiadiazole ring, an oxadizole ring, a pyrazole ring, and the like can be given. The aromatic ring formed by $Z^1$ is preferably a benzene ring, a pyridine ring, a pyrazine ring, a pyrimidine ring, or a pyridazine ring. The aromatic ring formed by $Z^1$ is more preferably a benzene ring, a pyridine ring, or a pyrazine ring. The aromatic ring formed by $Z^1$ is still more preferably a benzene ring or a pyridine ring. The aromatic ring formed by $Z^1$ is particularly preferably a pyridine ring.

The aromatic ring formed by $Z^1$ may form a condensed ring with another ring, and may have a substituent. As examples of the substituent, the substituents given as examples for the aliphatic hydrocarbon group, the aryl group, and the heterocyclic group represented by $R^1$ can be given.

A preferred compound of the formula (I) is a compound of the following formula (II).

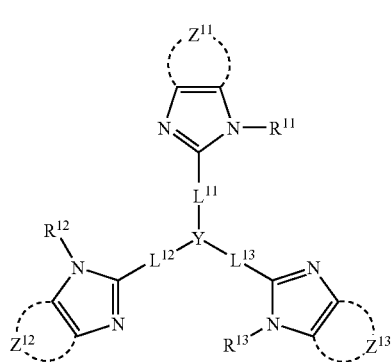

(II)

In the formula (II), $R^{11}$, $R^{12}$, and $R^{13}$ have the same meaning as $R^1$ in the formula (I). Preferred ranges of $R^{11}$, $R^{12}$, and $R^{13}$ are also the same as that of $R^1$. $Z^{11}$, $Z^{12}$, and $Z^{13}$ have the same meaning as $Z^1$ in the formula (I).

Preferred ranges of $Z^{11}$, $Z^{12}$, and $Z^{13}$ are also the same as that of $Z^1$. $L^{11}$, $L^{12}$, and $L^{13}$ respectively represent linking groups. As specific examples of A, $L^{11}$, $L^{12}$, and $L^{13}$, the trivalent groups given as specific examples of $L^1$ in the formula (I) may be applied. $L^{11}$, $L^{12}$, and $L^{13}$ are preferably a single bond, a bivalent aromatic hydrocarbon ring group, a bivalent aromatic heterocyclic group, or a linking group formed of a combination of these, and more preferably a single bond. $L^{11}$, $L^{12}$ and $L^{13}$ may have a substituent. As examples of the substituent, the substituents given as examples for the aliphatic hydrocarbon group, the aryl group, and the heterocyclic group represented by $R^1$ can be given.

Y represents a nitrogen atom, a 1,3,5-benzenetriyl group, or a 2,4,6-triazinetriyl group. The 1,3,5-benzenetriyl group may have substituents at the 2,4,6-positions. As examples of the substituent, an alkyl group, an aromatic hydrocarbon ring group, a halogen atom, and the like can be given.

Specific examples of the compound of the formula (I), particularly the formula (II) are given below.

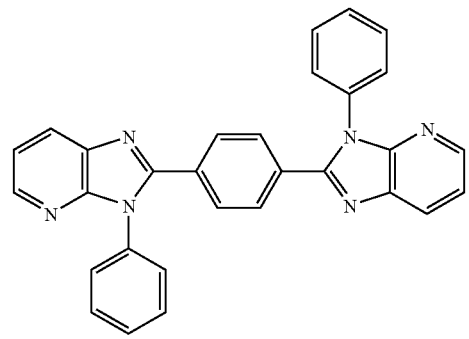

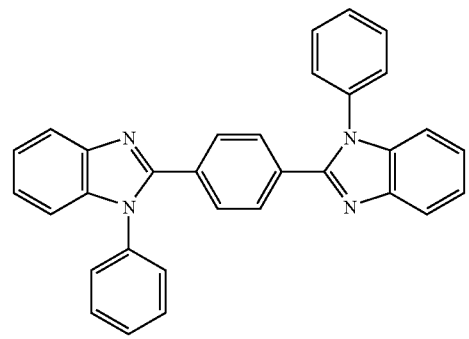

-continued
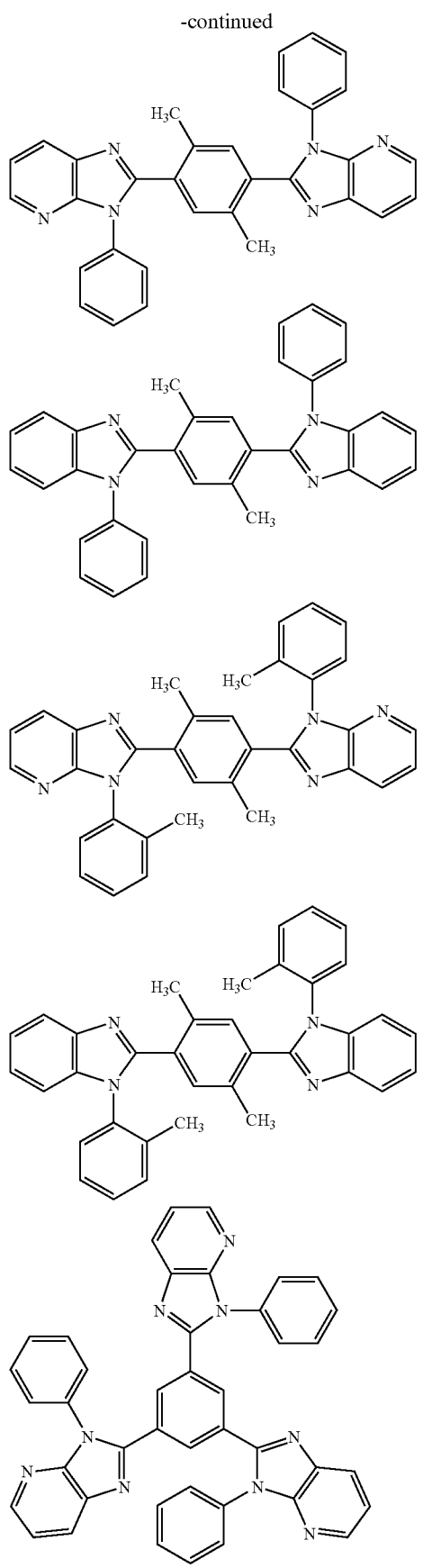
-continued
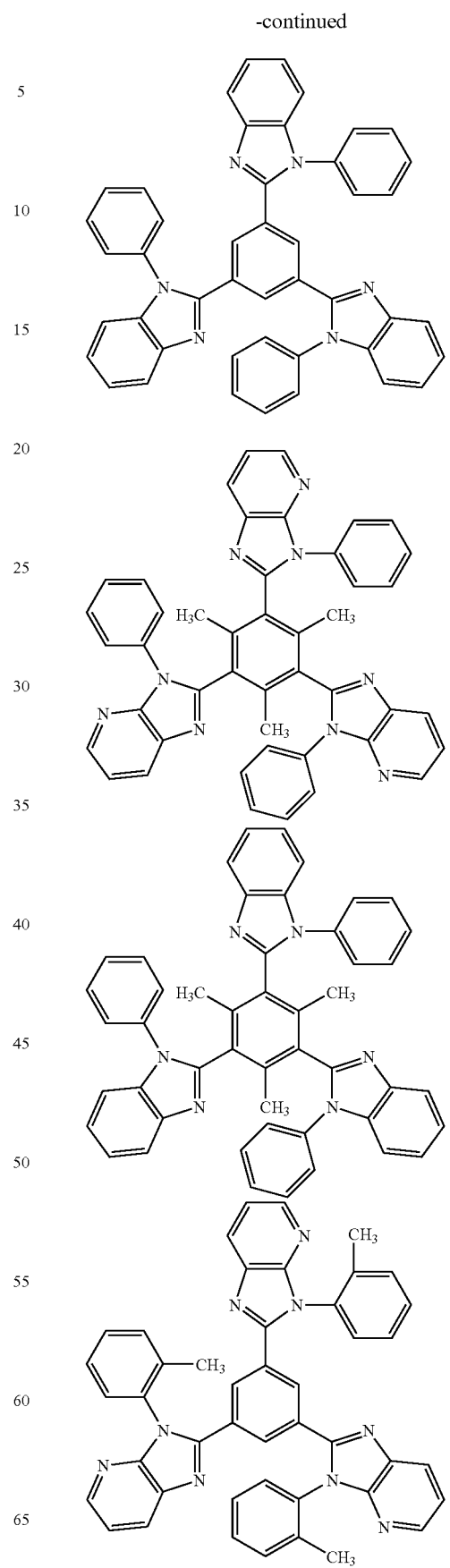

-continued

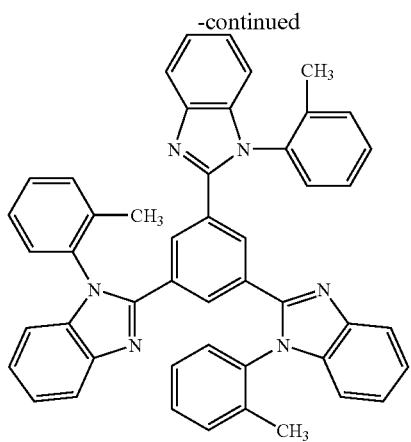

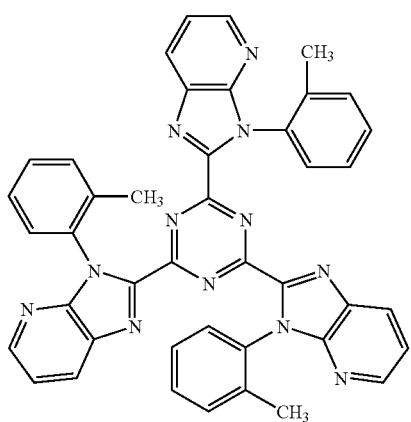

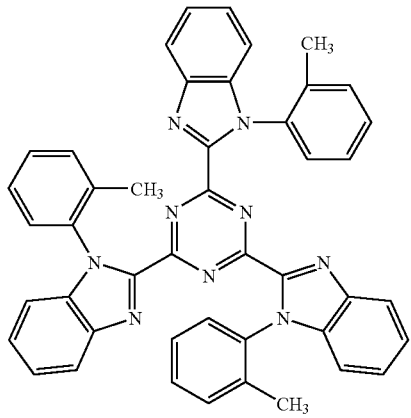

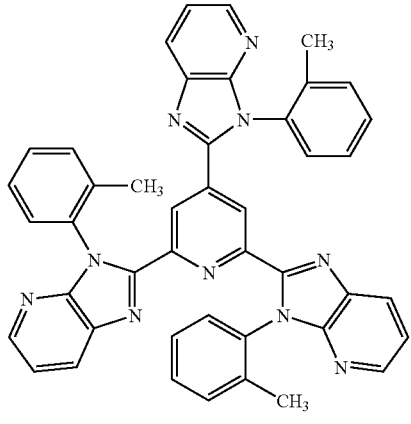

-continued

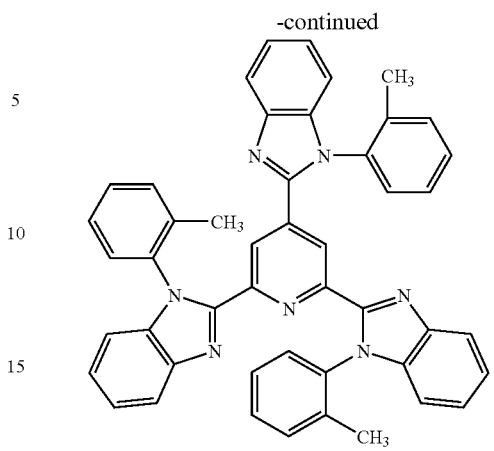

As the compound forming the electron transporting layer, derivatives having a triazine skeleton of the following formulas (a) and (b), derivatives having a pyrimidine skeleton of the following formula (c), silicon compounds of the following formula (d), and compounds of the following formula (e) may also be used.

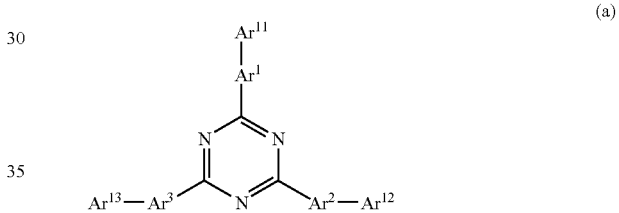

(a)

(b)

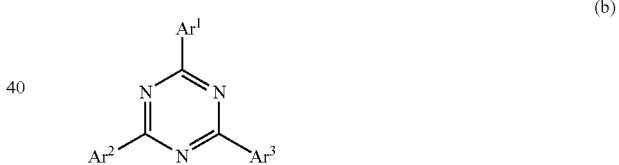

(c)

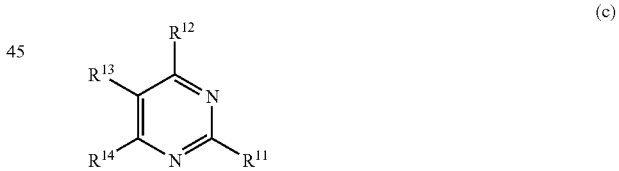

(d)

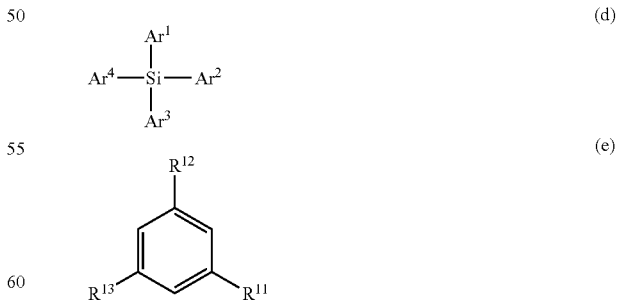

(e)

wherein $Ar^1$ to $Ar^4$, $Ar^{11}$ to $Ar^{13}$, and $R^{11}$ to $R^{14}$ individually represent substituted or unsubstituted aryl groups. The aryl group may be replaced with an alkyl group having 1 to 4 carbon atoms, a halogen, or the like.

Specific examples of the formulas (a) to (e) are given below.

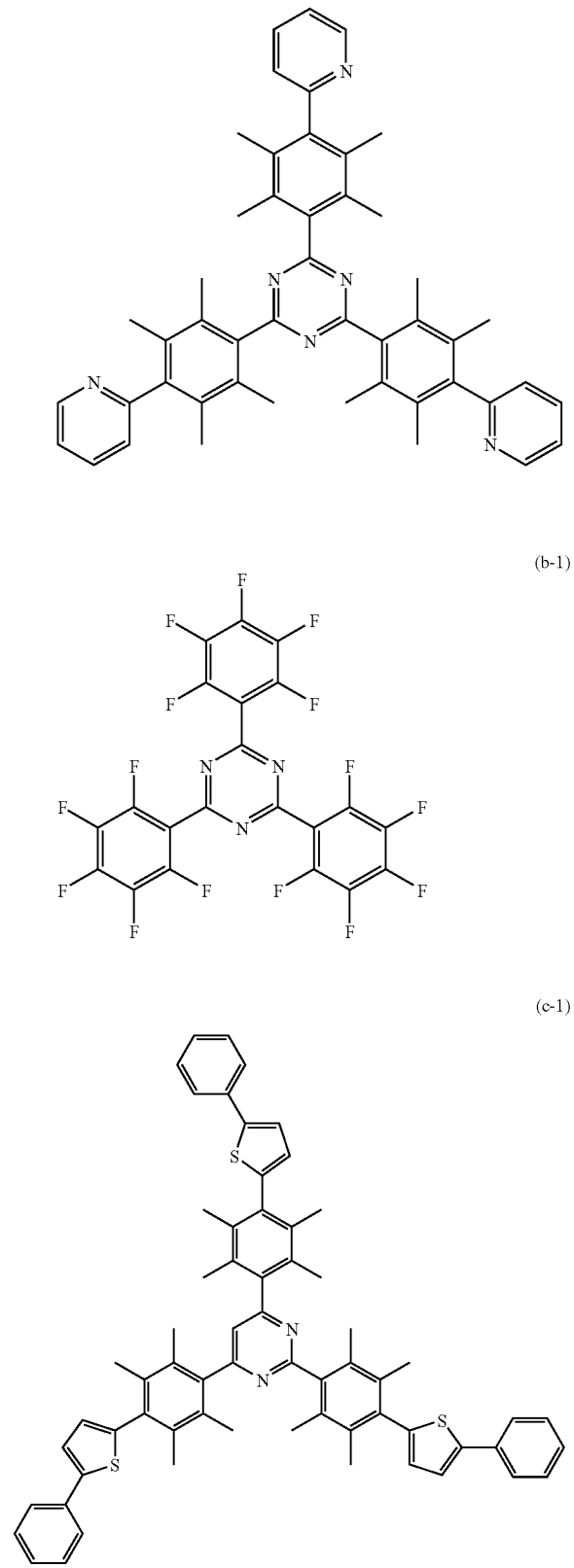

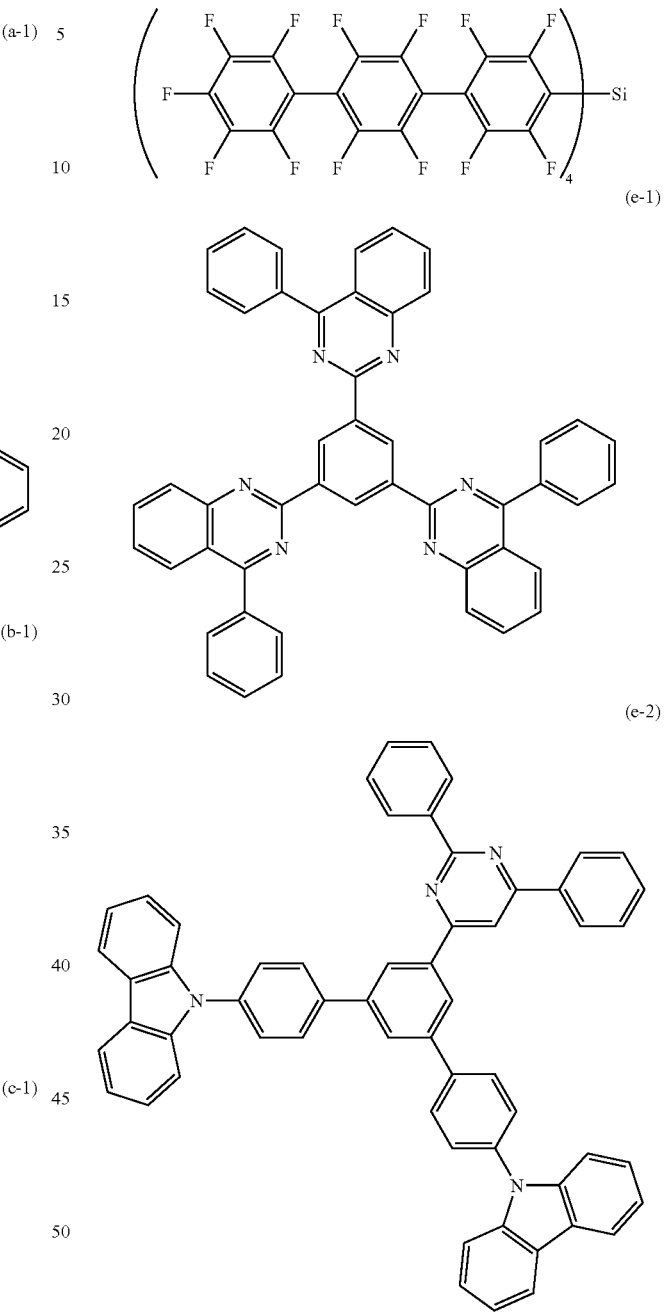

Specifically, a compound having one carbazolyl group and a trivalent nitrogen-containing hetero ring in claim 1 of Japanese Patent Application No. 2002-299810 can be given. In more detail, specific compounds having one carbazolyl group and a trivalent nitrogen-containing hetero ring disclosed on pages 13 to 19 of Japanese Patent Application No. 2002-299810 can be given. As means for obtaining a high singlet energy level and triplet energy level, it is particularly preferable that an m-bonding site be included in the molecular skeleton.

In the organic EL device according to the invention, an inorganic material may be added to the hole transporting layer and the electron transporting layer, as required, in order to further increase current efficiency or luminous efficiency. An inorganic material may be preferably used for the hole transporting layer. An inorganic material may be used between the electron-transporting layer and the metal cathode in order to further increase current (luminous) efficiency. As specific examples of the inorganic material, fluorides and oxides of alkali metals such as Li, Mg, and Cs can be given. As examples of a semiconductor forming the electron transporting layer, a single material or a combination of two or more of an oxide, nitride, or oxynitride containing at least one element selected from Ba, Ca, Sr, Yb, Al, Ga, In, Li, Na, Cd, Mg, Si, Ta, Sb, and Zn, and the like can be given. It is preferable that the inorganic compound forming the electron transporting layer be a microcrystalline or amorphous insulating thin film. If the electron transporting layer is formed of such an insulating thin film, a more uniform thin film is formed, whereby pixel defects such as dark spots can be reduced. As examples of such an inorganic compound, an alkali metal chalcogenide, alkaline earth metal chalcogenide, alkali metal halide, and alkaline earth metal halide can be given.

In the organic EL device according to the invention, the electron transporting layer may include a reducing dopant with a work function of 2.9 eV or less. In the invention, the reducing dopant is a compound which increases electron injecting efficiency.

In the invention, it is preferable that the reducing dopant be added to the interfacial region between the cathode and the organic thin film layer so that the reducing dopant reduces at least part of the organic layer contained in the interfacial region to produce anions. A preferred reducing dopant is at least one compound selected from the group consisting of an alkali metal, an alkaline earth metal oxide, an alkaline earth metal, a rare earth metal, an alkali metal oxide, an alkali metal halide, an alkaline earth metal oxide, an alkaline earth metal halide, a rare earth metal oxide, a rare earth metal halide, an alkali metal complex, an alkaline earth metal complex, and a rare earth metal complex.

As examples of preferred reducing dopants, at least one alkali metal selected from the group consisting of Na (work function: 2.36 eV), K (work function: 2.28 eV), Rb (work function: 2.16 eV), and Cs (work function: 1.95 eV), and at least one alkaline earth metal selected from the group consisting of Ca (work function: 2.9 eV), Sr (work function: 2.0 to 2.5 eV), and Ba (work function: 2.52 eV) can be given. A material with a work function of 2.9 eV is particularly preferable. The reducing dopant is preferably at least one alkali metal selected from the group consisting of K, Rb, and Cs, more preferably Rb or Cs, and particularly preferably Cs. These alkali metals exhibit a particularly high reducing capability so that an increase in the luminance and the lifetime of the organic EL device can be achieved by adding a relatively small amount of alkali metal to the electron injecting region.

As the alkaline earth metal oxide, BaO, SrO, CaO, $Ba_xSr_{1-x}O$ ($0<x<1$), and $Ba_xCa_{1-x}O$ ($0<x<1$) are preferable.

As examples of the alkali oxide or alkali fluoride, LiF, $Li_2O$, NaF, and the like can be given. The alkali metal complex, the alkaline earth metal complex, and the rare earth metal complex are not particularly limited insofar as the complex contains at least one of an alkali metal ion, an alkaline earth metal ion, and a rare earth metal ion as the metal ion.

As examples of the ligand, quinolinol, benzoquinolinol, acridinol, phenanthridinol, hydroxyphenyloxazole, hydroxyphenylthiazole, hydroxydiaryloxadiazole, hydroxydiarylthiadiazole, hydroxyphenylpyridine,. hydroxyphenylbenzimidazole, hydroxybenzotriazole, hydroxyfurborane, bipyridyl, phenanthroline, phthalocyanine, porphyrin, cyclopentadiene, β-diketone, azomethine, derivatives thereof, and the like can be given. Note that the ligand is not limited thereto.

The reducing dopant is preferably formed in the shape of a layer or islands. The thickness of the reducing dopant is preferably 0.05 to 8 nm when used in the shape of a layer.

As the method of forming the electron transporting layer including the reducing dopant, a method is preferable in which an organic material which is the emitting material or the electron injecting material which forms the interfacial region is simultaneously deposited while depositing the reducing dopant by resistance heating deposition to disperse the reducing dopant in the organic material. The dispersion concentration (molar ratio) is 100:1 to 1:100, and preferably 5:1 to 1:5. When forming the reducing dopant in the shape of a layer, the emitting material or the electron injecting material for the organic layer at the interface is formed in the shape of a layer, and thereafter the reducing dopant is deposited by resistance heating deposition to a thickness of preferably 0.5 nm to 15 nm. When forming the reducing dopant in the shape of islands, after forming the emitting material or the electron injecting material for the organic layer at the interface, the reducing dopant is deposited by resistance heating deposition to a thickness of preferably 0.05 to 1 nm.

In the organic EL device according to the invention, an insulator or a semiconductor inorganic compound may be used as the material forming the hole or electron transporting layer. If the hole or electron transporting layer is formed of a semiconductor, the hole or electron injecting properties can be improved by effectively preventing leakage of current.

A method of fabricating the organic EL device according to the invention is not particularly limited. The organic EL device according to the invention may be fabricated using a conventional fabrication method used for an organic EL device. In more detail, the device may be formed by vacuum deposition, casting, coating, spin coating, or the like.

EXAMPLES

Compounds of the following formulas were used in the examples and the comparative examples. The properties of these compounds were measured using the following methods.

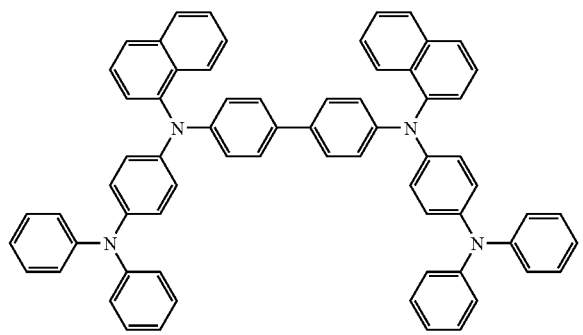

HIM

TCTA

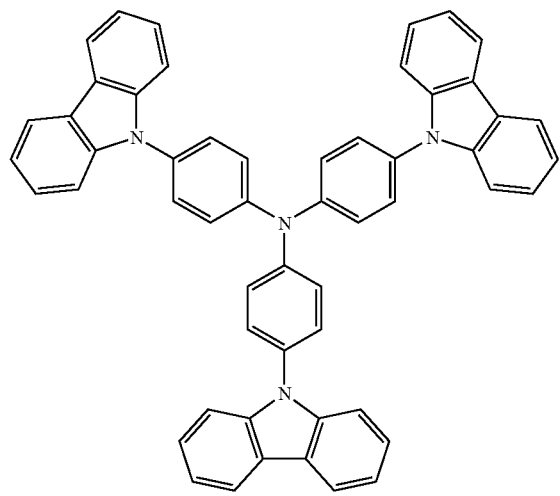

Compound (A)

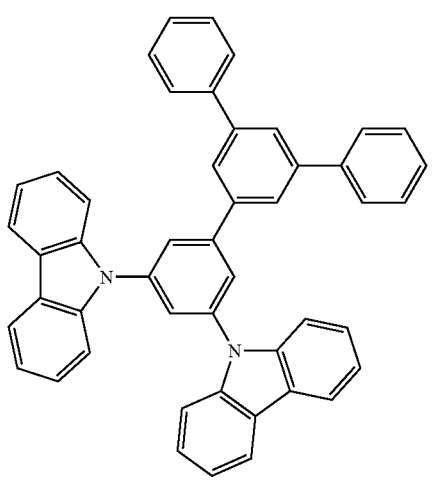

Compound (B1)

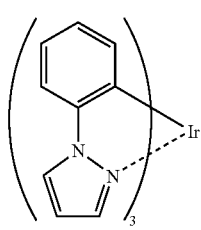

Compound (C)

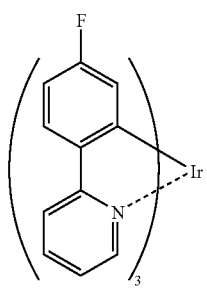

Compound (D)

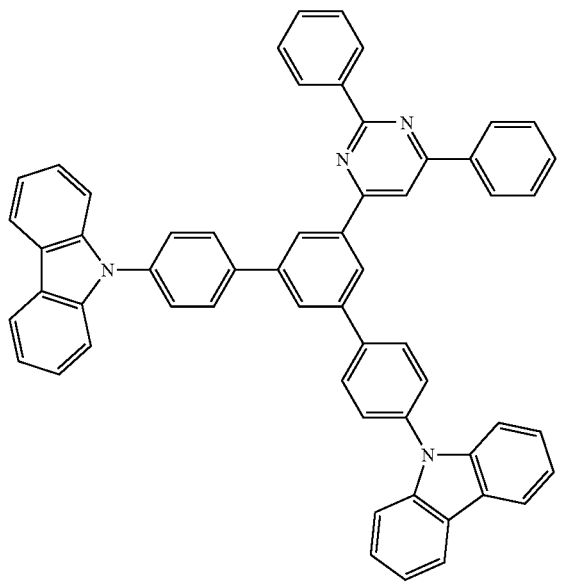

Alq₃

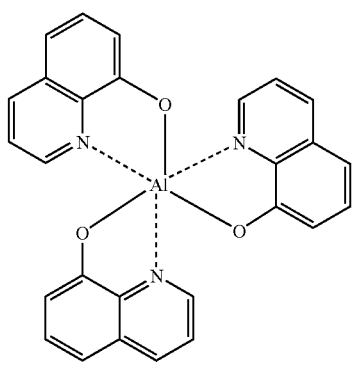

Compound (B2)

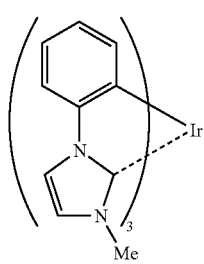

wherein Me indicates a methyl group.

(1) Ionization potential (Ip)

The ionization potential can be measured as follows. Light (excitation light) dispersed through a monochromator from a deuterium lamp is applied to a material. The resulting photoelectric emission is measured using an electrometer, and the photoelectric emission threshold from the resulting photoelectric emission photon energy curve is calculated using an extrapolation method. The ionization potential can be measured using a commercially available atmosphere ultraviolet photoelectron spectrometer AC-1 (manufactured by Riken Keiki Co., Ltd.), for example.

In more detail, a glass substrate was subjected to ultrasonic cleaning for five minutes in isopropyl alcohol, five minutes in water, and five minutes in isopropyl alcohol, and then subjected to UV cleaning for 30 minutes. A film was formed using a vacuum deposition device to obtain a thin film sample of the measurement target substance. The film was formed to a thickness of 2000 Å using an SGC-8MII manufactured by Showa Shinku Co., Ltd. at a final vacuum of $5.3 \times 10^{-4}$ Pa or less and a deposition rate of 2 Å/sec.

The ionization potential was measured using an atmospheric photoelectron spectrometer (AC-1 manufactured by Riken Keiki Co., Ltd.). Light obtained by dispersing ultraviolet rays from a deuterium lamp using a spectroscope was applied to the thin film sample, and the emitted photoelectrons were measured using an open counter.

When the ionization potential was 6.0 eV or less, the intersection of the background and the square root of the quantum efficiency in the photoelectron spectrum in which the square root of the quantum efficiency was plotted along the vertical axis and the energy of applied light was plotted along the horizontal axis (measured at an interval $\Delta$ of 0.05 eV) was taken as the ionization potential.

When the ionization potential was greater than 6.0 eV, the ionization potential was determined by converting the HOMO level obtained by ultraviolet photoelectron spectroscopy (UPS) measurement.

(2) Singlet Energy Level ($Eg^S$)

The compound was dissolved in toluene to obtain a $10^{-5}$ mol/l solution. The absorption spectrum was measured using a spectro-photometer (U3410 manufactured by Hitachi, Ltd.). A line tangent to the UV absorption spectrum was drawn at the rising edge on the longer wavelength side, and the wavelength (absorption edge) at which the tangent line intersects the horizontal axis was determined. This wavelength was converted into an energy value to determine the singlet energy level.

(3) Triplet Energy Level ($Eg^T$)

The lowest excited triplet energy level $Eg^T$ was measured as follows. The lowest triplet energy level was measured with a FLUOROLOG II manufactured by SPEX at a concentration of 10 μmol/l and a temperature of 77 K using EPA (diethyl ether: isopentane: isopropyl alcohol =5:5:2 (volume ratio)) as a solvent and a quartz cell. A line tangent to the resulting phosphorescence spectrum was drawn at the rising edge on the shorter wavelength side, and the wavelength (absorption edge) at which the tangent line intersects the horizontal axis was determined. This wavelength was converted into an energy value.

(4) Electron Affinity (Af)

The electron affinity (Af) was calculated using the following method.

$$Af=Ip-Eg^s(eV)$$

(5) Peak Wavelength in Ultraviolet Luminescence Region

The peak wavelength in the ultraviolet luminescence region was measured using the following method. The fluorescence spectrum was measured at a concentration of 10 μmol/l and a temperature of 296 K using methylene chloride as a solvent and a quartz cell. Excitation light was applied to the sample placed in the quartz cell. The peak wavelength was determined from the resulting fluorescence spectrum.

The peak wavelength may be measured using a commercially available instrument such as FLUOROLOG II manufactured by SPEX or F4500 manufactured by Hitachi, Ltd.

(6) Luminous Intensity Ratio with Respect to Luminous Peak Wavelength Intensity from Device The EL luminance of the device was set at 100 cd/m$^2$, and the emission spectrum was measured. The emission spectrum was measured using a spectroscope. The fluorescence spectrum of the measurement target sample prepared under the same conditions as in the measurement of the phosphorescence spectrum was measured using the method described in "(3) Triplet energy level" to determine the peak emission wavelength of each dopant complex.

The luminous intensity of the dopant in EL emission from the device was determined at each peak wavelength. The luminous intensity ratio was determined from the resulting value and the luminous intensity at the emission peak wavelength of the device.

Example 1

A glass substrate (25×75×1.1 mm, manufactured by Geomatics) provided with an ITO transparent electrode was subjected to ultrasonic cleaning for five minutes in isopropyl alcohol and then subjected to UV ozone cleaning for 30 minutes. The cleaned glass substrate with the linear transparent electrode was installed in a substrate holder of a vacuum deposition device, and an HIM ($Eg^S$=3.3 eV, $Eg^T$=2.5 eV) film with a thickness of 40 nm was formed by resistance heating deposition on the surface of the glass substrate on which the linear transparent electrode was formed so that the transparent electrode was covered. The HIM film functioned as a hole transporting layer (hole injecting layer). A TCTA($Eg^S$=3.3 eV, $Eg^T$=3.0 eV) film (hole transporting layer) with a thickness of 40 nm was formed on the HIM film by resistance heating deposition.

As a host compound, the compound (A) (Ip=6.0 eV, $Eg^S$=3.4 eV, $Eg^T$=2.9 eV, Af=2.6 eV) was deposited on the TCTA film to a thickness of 20 nm to form an emitting layer. The Ir metal complex compound (B1)(peak wavelength in the ultraviolet luminescence region: 414 nm (77 K), Ip=5.3 eV, $Eg^S$=3.0 eV, $Eg^T$=3.1 eV, Af=2.3 eV) was added at the same time as an ultraviolet luminescent dopant. The concentration of the metal complex compound (B1) in the emitting layer was 7.5 wt %. The compound (A) was then deposited as a host material to a thickness of 20 nm to form an emitting layer. The Ir metal complex compound (C) (Ip=5.65 eV, $Eg^S$=2.58 eV, $Eg^T$=2.6 eV, Af=3.07 eV) was added at the same time as a visible luminescent dopant. The concentration of the metal complex compound (C) in the emitting layer was 7.5 wt %. This stacked films functioned as an emitting layer.

The compound (D) ($Eg^S$=3.8 eV, $Eg^T$=2.9 eV) was formed on the resulting film to a thickness of 25 nm. This film functioned as an electron transporting layer. Alq$_3$ ($Eg^S$=2.7 eV, $Eg^T$=2.1 eV) was formed on the resulting film to a thickness of 5 nm. This film functioned as an electron transporting layer (electron injecting layer). Lithium fluoride was then deposited to a thickness of 0.1 nm, and aluminum was deposited to a thickness of 150 nm. This Al/LiF film functioned as a cathode. An organic EL device was thus fabricated.

After sealing the resulting device, electricity was supplied to the device for test. Blue green light with a luminance of 125 cd/M$^2$ was obtained at a voltage of 6.0 V and a current density of 0.4 mA/cm$^2$. The luminous efficiency was 31 cd/A.

The device was caused to emit light at a luminance of 100 cd/m$^2$, and the EL spectrum was measured. The peak wavelength was 486 nm. Since the luminous intensity (emission wavelength peak (414 nm)) of the complex (B1) in the EL spectrum was zero, the intensity ratio was zero.

Example 2

A device was fabricated in the same manner as in Example 1 except for using the compound (B2) (peak wavelength in the ultraviolet luminescence region: 400 nm, Ip=5.1 eV, $Eg^s$=3.54 eV (absorption edge), $Eg^T$=3.3 eV, Af=1.56 eV) as the ultraviolet luminescent dopant instead of the compound (B1).

After sealing the resulting device, electricity was supplied to the device for test. Blue green light with a luminance of 105 cd/m$^2$ was obtained at a voltage of 7.0 V and a current density of 0.35 mA/cm$^2$. The luminous efficiency was 30 cd/A.

The device was caused to emit light at a luminance of 100 cd/m$^2$, and the EL spectrum was measured. The peak wavelength was 486 nm. Since the luminous intensity (emission wavelength peak (400 nm)) of the complex (B2) in the EL spectrum was zero, the intensity ratio was zero.

INDUSTRIAL APPLICABILITY

The blue organic EL device according to the invention with a high luminous efficiency and a long lifetime may be used as an organic EL material of each color including blue, may be applied in various fields such as a display device, display, backlight, illumination light source, sign, signboard, and interior, and is particularly suitable as a display device for a color display.

The invention claimed is:

1. A blue organic electroluminescent device comprising at least an emitting layer between an anode and a cathode, the emitting layer comprising a host material and a plurality of dopants, at least one of the dopants having ultraviolet luminescent properties, and at least one of the dopants having visible luminescent properties.

2. The blue organic electroluminescent device according to claim 1, wherein the dopant having ultraviolet luminescent properties has a peak of 450 nm or less in the ultraviolet luminescence region.

3. The blue organic electroluminescent device according to claim 1, wherein the dopant having ultraviolet luminescent properties has a triplet energy gap greater than the triplet energy gap of the dopant having visible luminescent properties.

4. The blue organic electroluminescent device according to claim 1, wherein at least one of the dopants has an ionization potential lower than the ionization potential of the host material.

5. The blue organic electroluminescent device according to claim 1, wherein at least one of the dopants has an electron affinity lower than the electron affinity of the host material.

6. The blue organic electroluminescent device according to claim 1, wherein at least one of the dopants is a heavy metal complex.

7. The blue organic electroluminescent device according to claim 1, wherein all of the dopants are heavy metal complexes.

8. The blue organic electroluminescent device according to claim 6, wherein at least one of the heavy metal complexes is a carbene complex or a pyrazole complex.

9. The blue organic electroluminescent device according to claim 6, wherein at least one of the dopants has an ionization potential lower than that of the host material and a luminous intensity one tenth or less that of the luminous (EL) peak wavelength from the device.

10. The blue organic electroluminescent device according to claim 6, comprising a hole transporting layer between the emitting layer and the anode, wherein at least one of the heavy metal complexes has a triplet energy gap smaller than the triplet energy gap of at least one compound forming the hole transporting layer.

11. The blue organic electroluminescent device according to claim 10, wherein at least one of the heavy metal complexes has a triplet energy gap smaller than the triplet energy gap of at least one compound forming the hole transporting layer in an amount of 0.2 eV or more.

12. The blue organic electroluminescent device according to claim 6, comprising an electron transporting layer between the emitting layer and the cathode, wherein at least one of the heavy metal complexes has a triplet energy gap smaller than the triplet energy gap of at least one compound forming the electron transporting layer.

13. The blue organic electroluminescent device according to claim 12, wherein at least one of the heavy metal complexes has a triplet energy gap smaller than the triplet energy gap of at least one compound forming the electron transporting layer in an amount of 0.2 eV or more.

14. The blue organic electroluminescent device according to claim 6, comprising a hole transporting layer between the emitting layer and the anode and an electron transporting layer between the emitting layer and the cathode, wherein at least one of the heavy metal complexes has a triplet energy gap smaller than the triplet energy gap of at least one of compounds forming the hole transporting layer and the electron transporting layer.

15. The blue organic electroluminescent device according to claim 14, wherein at least one of the heavy metal complexes has a triplet energy gap smaller than the triplet energy gap of at least one of compounds forming the hole transporting layer and the electron transporting layer in an amount of 0.2 eV or more.

16. The blue organic electroluminescent device according to claim 1, wherein the visible luminescent dopant is a metal complex of Ir, Pt, Os, Pd or Au.

17. The blue organic electroluminescent device according to claim 1, wherein the host material is selected from the group consisting of amine derivatives, carbazole derivatives, oxadiazole derivatives, triazole derivatives, benzoxazole type, benzothiazole type, and benzimidazole type fluorescent whitening agents, metal chelate oxanoid compounds and styryl compounds.

18. The blue organic electroluminescent device according to claim 1, wherein the host material is an organic compound having at least one carbazolyl group.

19. The blue organic electroluminescent device according to claim 1, wherein the ultraviolet luminescent dopant is selected from the group consisting of

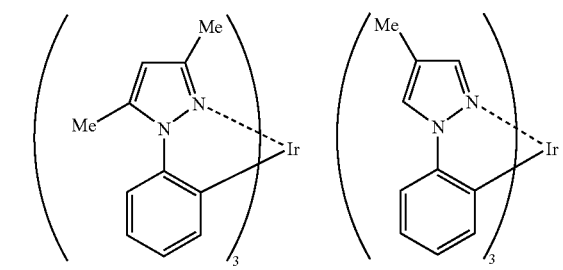

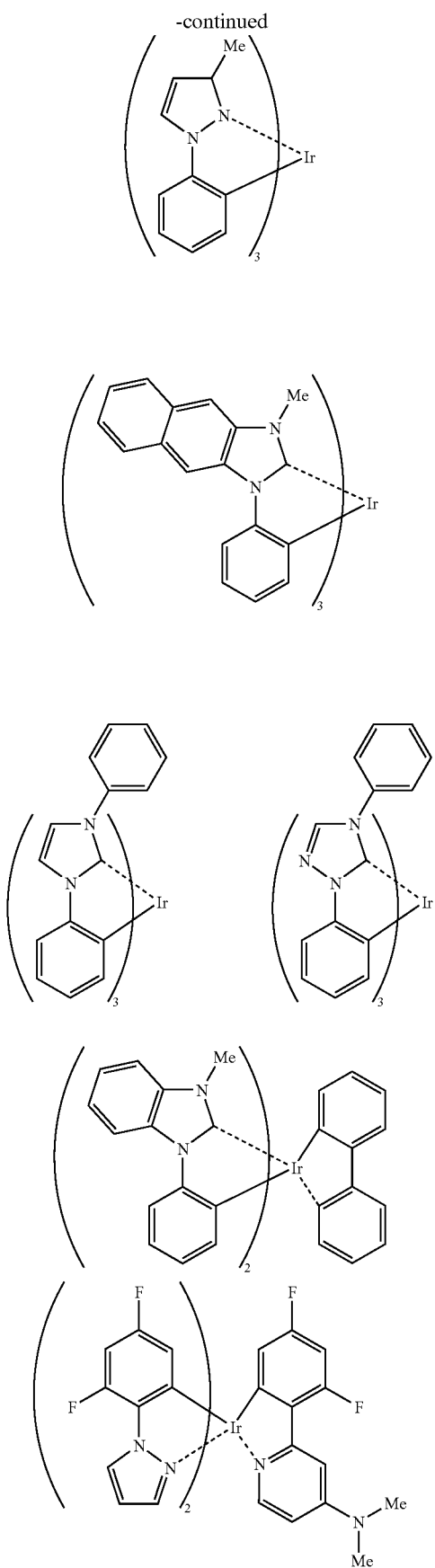
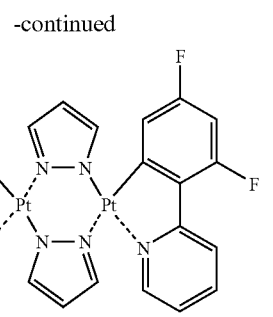
20. The blue organic electroluminescent device according to claim 1, wherein the visible luminescent dopant is a metal complex of Ir, Pt, Os, Pd or Au, wherein the host material is an organic compound having at least one carbazolyl group, and wherein the ultraviolet luminescent dopant is selected from the group consisting of -continued
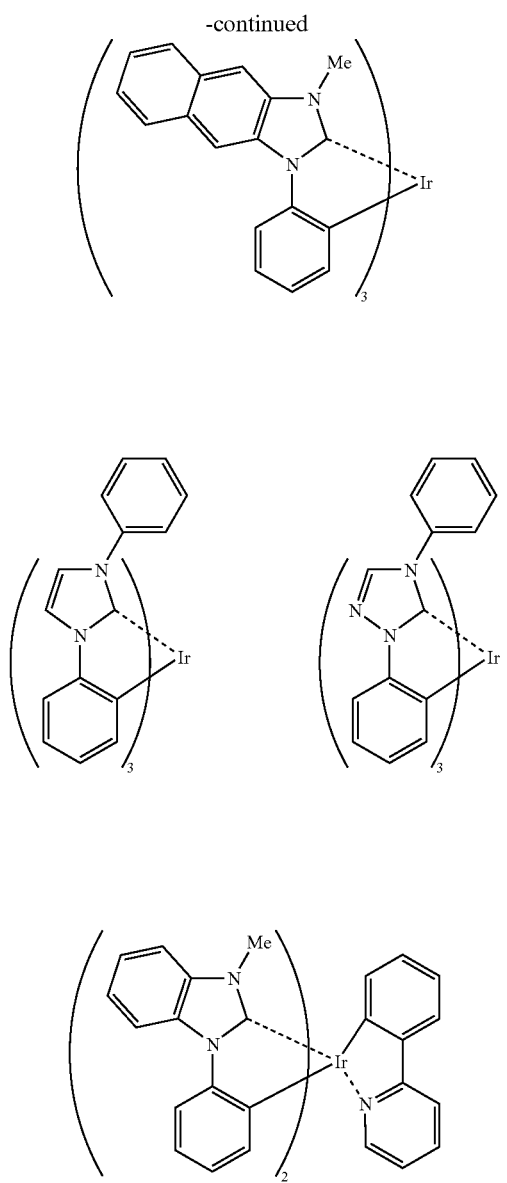
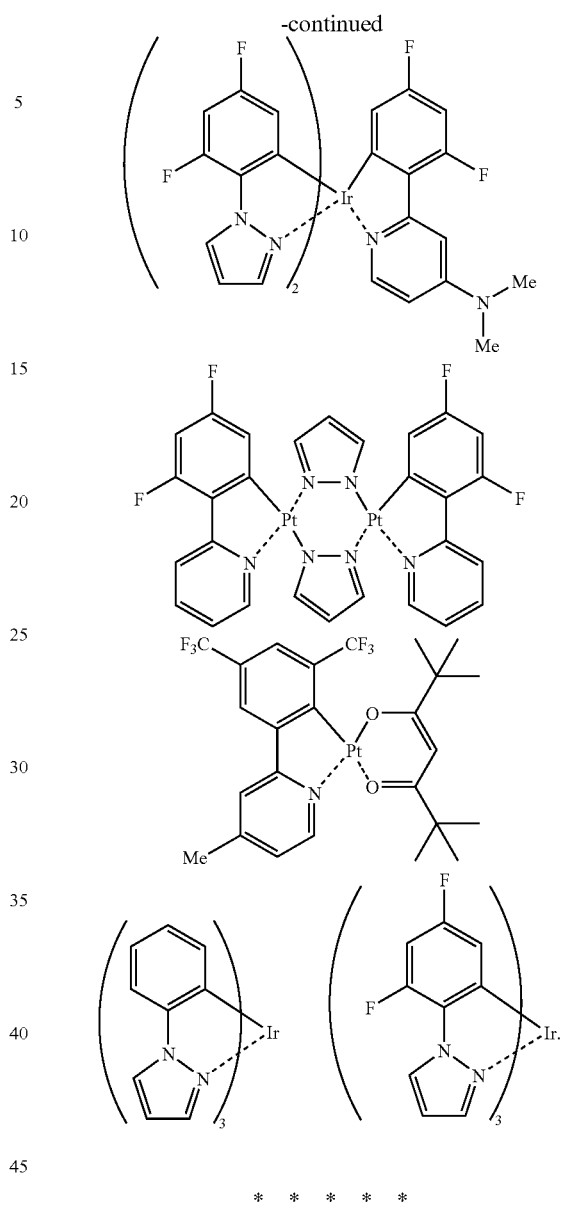
* * * * *